United States Patent
Takahashi et al.

(10) Patent No.: US 6,768,651 B2
(45) Date of Patent: Jul. 27, 2004

(54) COMMUNICATION DEVICE AND PLUG-IN UNIT THEREFOR

(75) Inventors: Tsutomu Takahashi, Kawasaki (JP); Katsuya Fujii, Kawasaki (JP); Hisao Hayashi, Kawasaki (JP); Shiro Tani, Kawasaki (JP); Kazunori Oomori, Fukuoka (JP); Koichi Namimatsu, Fukuoka (JP); Hideki Zenitani, Osaka (JP); Masato Konishi, Kawasaki (JP)

(73) Assignees: Fujitsu Limited, Kawasaki (JP); Fujitsu Denso Ltd., Kawasaki (JP)

( * ) Notice: Subject to any disclaimer, the term of this patent is extended or adjusted under 35 U.S.C. 154(b) by 0 days.

(21) Appl. No.: 09/813,079

(22) Filed: Mar. 20, 2001

(65) Prior Publication Data

US 2002/0012238 A1 Jan. 31, 2002

(30) Foreign Application Priority Data

Jul. 31, 2000 (JP) ........................................ 2000-232335

(51) Int. Cl.$^7$ .............................. H05K 7/14; H05K 7/18; H05K 7/20
(52) U.S. Cl. ...................... 361/801; 361/688; 361/692; 361/694; 361/695; 361/727; 361/728; 361/741; 361/756; 361/788; 361/791; 361/796; 361/802
(58) Field of Search ................................ 361/683–686, 361/724–732, 733, 736, 740, 741, 747, 748, 752, 753, 756, 759, 785, 787, 788, 791, 796–802, 807, 816, 818, 687–695; 312/223.1, 223.2; 211/41.17

(56) References Cited

U.S. PATENT DOCUMENTS

| | | | | |
|---|---|---|---|---|
| 5,006,959 A | * | 4/1991 | Freige et al. | 361/687 |
| 5,410,448 A | * | 4/1995 | Barker, III et al. | 361/695 |
| 5,949,646 A | * | 9/1999 | Lee et al. | 361/695 |
| 6,242,690 B1 | * | 6/2001 | Glover | 174/35 GC |
| 6,291,766 B1 | * | 9/2001 | Komai | 174/35 R |
| 6,480,391 B1 | * | 11/2002 | Monson et al. | 361/752 |

* cited by examiner

Primary Examiner—Phuong T. Vu
(74) Attorney, Agent, or Firm—Katten Muchin Zavis Rosenman

(57) ABSTRACT

A communication device includes a sub-rack unit and a plurality of plug-in units. The sub-rack unit includes a back wiring board having first connectors arranged in lines thereon, and a frame plate including vertical ribs and placed on said back wiring board so that the vertical ribs separate the lines of the first connectors. Each of the plug-in units includes: a printed board including top and bottom sides and parallel first and second sides, the printed board having second connectors provided on the first side thereof; a metal case including top and bottom faces, and parallel first and second side faces so as to cover the printed board; and first and second spring members. Each of said plug-in units is mounted in the sub-rack unit with the first and second connectors being connected so that the first and second side faces of the metal case are pressed outward against the vertical ribs of the frame plate by resilient forces of the first and second spring members, respectively.

12 Claims, 26 Drawing Sheets

F I G. 1 8
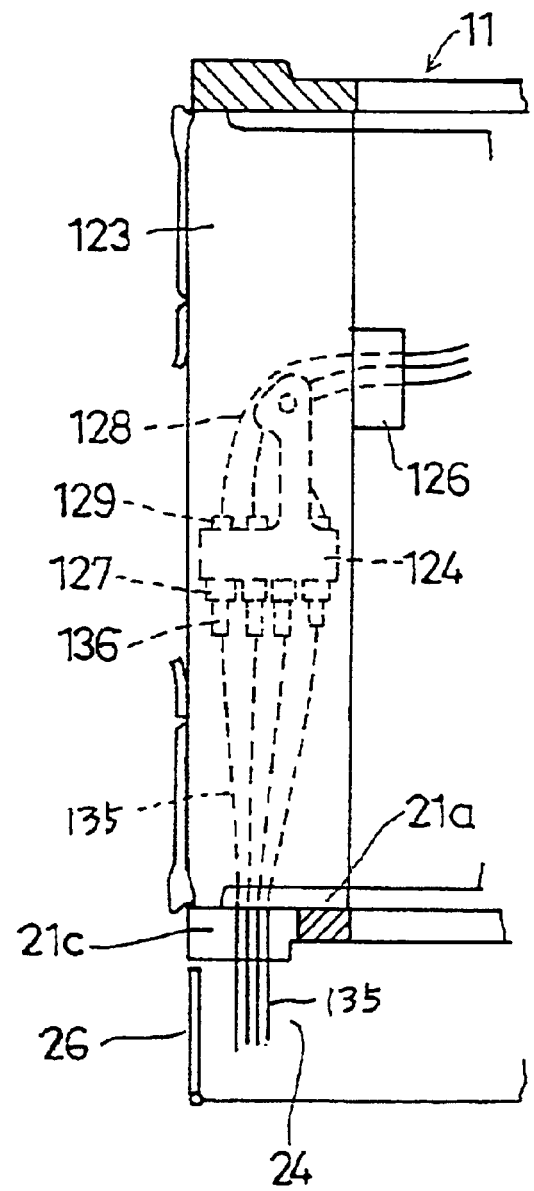

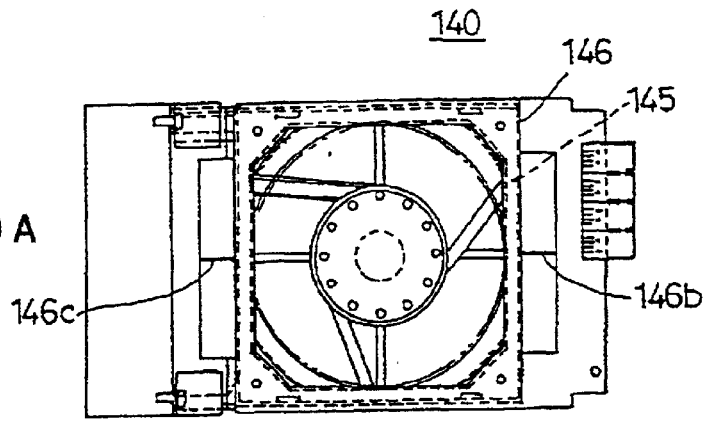
FIG. 20A
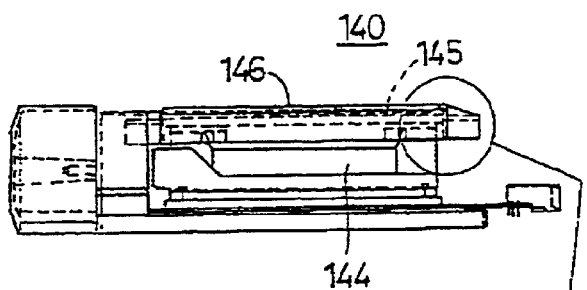
FIG. 20B
FIG. 20C
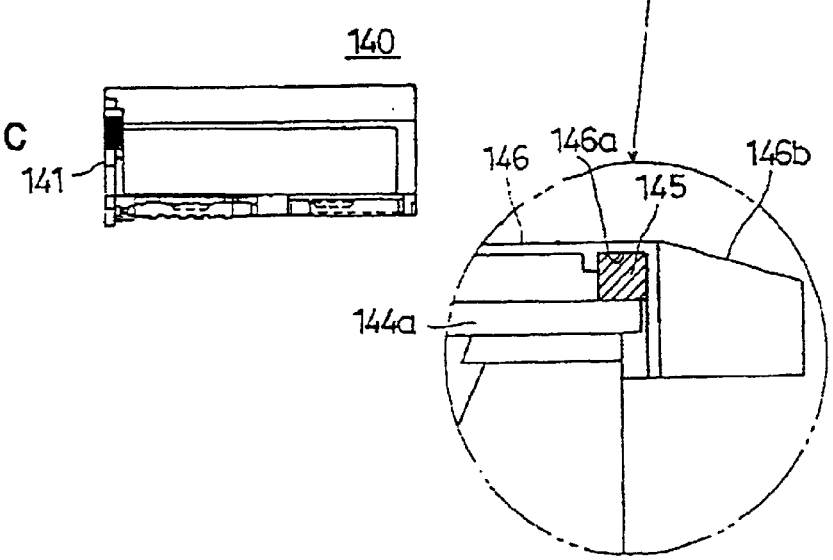

P>ATMOSPHERIC PRESSURE

COMMUNICATION DEVICE AND PLUG-IN UNIT THEREFOR

BACKGROUND OF THE INVENTION

1. Field of the Invention

The present invention generally relates to communication devices installed in communication stations and plug-in units therefor, and more particularly to a communication device having reduced EMI (electromagnetic interference) that is an electromagnetic interference noise generated from the device, reinforced resistance to static electrical discharge, increased flame resistance, and increased efficiency of forced air-cooling.

The importance of communication in recent years requires an improvement in the quality of communication devices installed in communication stations. In terms of quality, the communication devices are required to keep EMI emitted therefrom sufficiently low. For instance, the communication devices are required to satisfy the FCC. part 18 standard employed in North America.

2. Description of the Related Art

A common communication device includes a plurality of plug-in units mounted side by side in a sub-rack attached to a rack.

Conventionally, EMI has been coped with by covering the front side of a sub-rack having plug-in units plugged thereinto. Although this provides a shield that collectively shuts off the electromagnetic interference noises radiated from the respective plug-in units, this may not be sufficient as a measure against the EMI.

SUMMARY OF THE INVENTION

It is a general object of the present invention to provide a communication device and a plug-in unit therefor in which the above-described disadvantage is eliminated.

A more specific object of the present invention is to provide a communication device and a plug-in unit therefor that provide a shield against electromagnetic interference noises of higher frequencies.

The above objects of the present invention are achieved by a communication device including: a sub-rack unit including a back wiring board having first connectors arranged in lines thereon, and a frame plate including vertical ribs and placed on the back wiring board so that the vertical ribs separate the lines of the first connectors; and a plurality of plug-in units each including a printed board including top and bottom sides and parallel first and second sides perpendicular to the top and bottom sides, the printed board having second connectors provided on the first side thereof, a metal case including top and bottom faces and parallel first and second side faces perpendicular to the top and bottom faces so as to cover the printed board, and first and second spring members, wherein each of said plug-in units is mounted in the sub-rack unit with the first and second connectors being connected so that the first and second side faces of the metal case are pressed outward against the vertical ribs of the frame plate by resilient forces generated by elastic deformation of the first and second spring members, respectively.

This communication device provides a shield against an electromagnetic interference wave of a frequency as high as 10 GHz. Without the first and second spring members, the metal case is pressed against the vertical ribs by resilient forces of their own, which may cause an imperfect contact of the metal case with the vertical ribs. In this case, a shield effect is limited to electromagnetic waves of lower frequencies, and is not produced on an electromagnetic wave of a frequency as high as approximately 10 GHz. According to this communication device, the resilient forces of the spring members press, against the vertical ribs of the frame plate, the edge of an opening formed on an end of the metal case in a direction in which each plug-in unit is inserted into the sub-rack unit. Therefore, the edge of the opening securely contacts the vertical ribs of the frame plate. This provides a shield against, for instance, an electromagnetic interference noise of a frequency as high as 10 GHz, not to mention electromagnetic interference noises of lower frequencies.

Therefore, a shield is provided against electromagnetic interference noises of high frequencies as well as those of low frequencies that leak out from each plug-in unit mounted in the sub-rack unit.

The above objects of the present invention are also achieved by a plug-in unit to be mounted in a sub-rack unit including connectors, which plug-in unit includes: a printed board including connectors provided on a side thereof, the connectors being connected with the connectors of the sub-rack unit so that the plug-in unit is mounted therein; a metal case including top and bottom faces, and parallel first and second side faces perpendicular to the top and bottom faces so as to cover the printed board; and first and second spring members elastically pressing outward the first and second side faces of the metal case, respectively.

This plug-in unit has the same effect as the above-described communication device by providing a reliable contact of the metal case with the sub-rack unit when the plug-in unit is mounted therein.

The above objects of the present invention are also achieved by a plug-in unit to be mounted in a sub-rack unit including connectors, which plug-in unit includes: a printed board including parallel first and second sides and having connectors provided on the first side thereof, the connectors being connected with the connectors of the sub-rack unit so that the plug-in unit is mounted therein; a photoelectric conversion module provided on the printed board; a front member attached to the second side of the printed board, the front member having a space formed therein; and a rotating member holding adapters for connecting optical connectors, the rotating member being supported in the space of the front member so as to be rotationally moved between a position in which the rotating member is housed in the space with the adapters facing downward and a position in which the adapters protrude from the front member through an opening formed on a first side thereof to face slantingly downward, the first side facing a reverse direction to said printed board, wherein plugs provided on ends of optical fibers extending from the photoelectric module are connected to the adapters.

According to this plug-in unit, the eyes of a user are protected from laser beams when the user connects the plugs of the optical fibers with the adapters. Further, this plug-in unit is allowed to have a larger number of adapters than a conventional plug-in unit.

The above objects of the present invention are also achieved by a communication device including: a sub-rack unit including a back wiring board having connectors, and first and second guide rail parts being attached to a top side and a lower portion of the sub-rack unit, respectively; a plurality of plug-in units being inserted along the first and second guide rail parts into the sub-rack unit to be plugged into the connectors of the sub-rack unit; a member for forming an air reservoir room formed under the second guide rail parts; and a plurality of motor-fan units each having a motor fan, the motor-fan units being plugged into the sub-rack unit under the member for forming the air reservoir room.

According to this communication device, air from the plugged motor-fan units enters the air reservoir room first and then the sub-rack unit. By this structure, the air equally blows up inside all the mounted plug-in units so that all the plug-in units are forcibly air-cooled equally.

The above objects of the present invention are further achieved by a plug-in unit to be mounted in a sub-rack unit, which plug-in unit includes: a front member including a convex part; and first and second card lever assemblies attached to top and bottom end portions of the front member, respectively, each of the first and second card lever assemblies including a main body and an auxiliary lever having a hook part and supported by the main body so as to be rotationally moved around a rotation center, the hook part being formed on an elastically deformable frame part having a frame shape with a hole formed therein, wherein the hook part of the auxiliary lever is positioned on a level with the rotation center in a direction in which the plug-in unit is inserted into the sub-rack unit when the hook part engages with the convex part of the front member.

According to this plug-in unit, the hook part is not disengaged from the convex part even if a force to dismount the plug-in unit from the sub-rack unit is exerted. Therefore, the plug-in unit is mounted in the sub-rack unit in a locked state with high reliability.

BRIEF DESCRIPTION OF THE DRAWINGS

Other objects, features and advantages of the present invention will become more apparent from the following detailed description when read in conjunction with the accompanying drawings, in which:

FIG. 18 is a diagram showing a state in which the communication plug-in unit including the photoelectric conversion module is mounted in the sub-rack unit;

FIGS. 20A through 20C are a top plan view, an $X_1$ side view, and a front ($Y_2$) side view of the motor-fan plug-in unit of FIG. 19, respectively;

DETAILED DESCRIPTION OF THE PREFERRED EMBODIMENTS

A description will now be given, with reference to the accompanying drawings, of an embodiment of the present invention.

Figure 1:
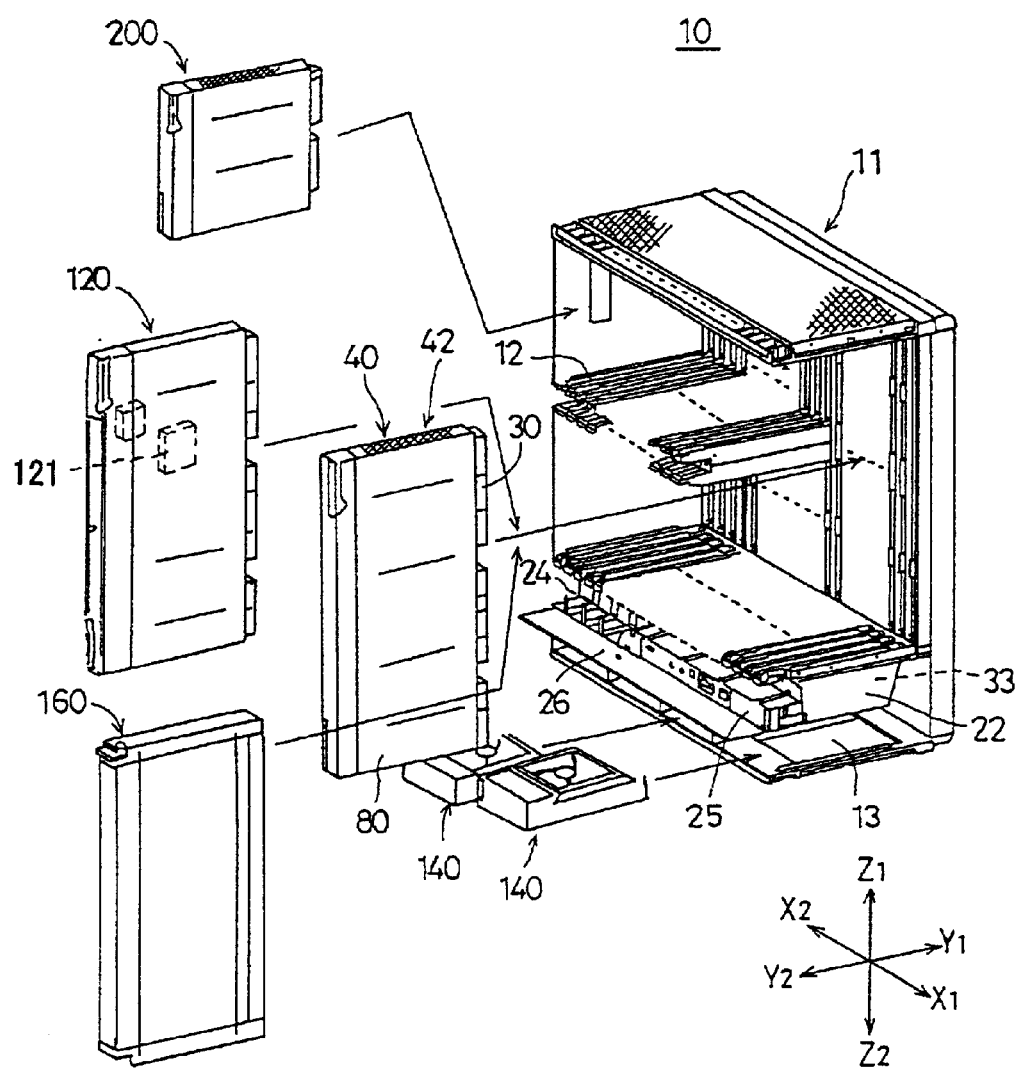
FIG. 1 is a perspective view of a communication device according to an embodiment of the present invention.

FIG. 1 is a perspective view of a communication device 10 according to the embodiment of the present invention. The communication device 10 is installed in a telephone office with a sub-rack unit 11 thereof being attached to the pillars of a rack (not shown). The X-axis, Y-axis, and Z-axis correspond to the width, depth, and height of the communication device 10, respectively.

A Structure of the Communication Device 10

The communication device 10 includes the sub-rack unit 11, normal-size communication plug-in units 40, normal-size communication plug-in units 120 each having a photoelectric conversion module 121, filler plug-in units 160, small-size communication plug-in units 200, and motor-fan plug-in units 140. The above-describe plug-in units 40, 120, 160, 200, and 140 are inserted into the sub-rack unit 11 from its front side in the $Y_1$ direction. For simplicity purposes, only one each is shown in FIG. 1 of the respective plug-in units 40, 120, 160, and 200.

The small-size communication plug-in unit 200 is supported by a corresponding one of guide rail members 12. The filler plug-in unit 160 fills a space left empty in the sub-rack unit 11 by the communication plug-in unit 40 and the like. Each motor-fan plug-in unit 140 is mounted in a corresponding one of motor-fan plug-in unit housing parts 13 formed in the lower portion of the sub-rack unit 11. The communication plug-in units 40, 120, and 200 are forced to be air-cooled by upward airflow generated by each motor-fan plug-in unit 140.

A Structure of the Sub-rack Unit 11

Figure 2:
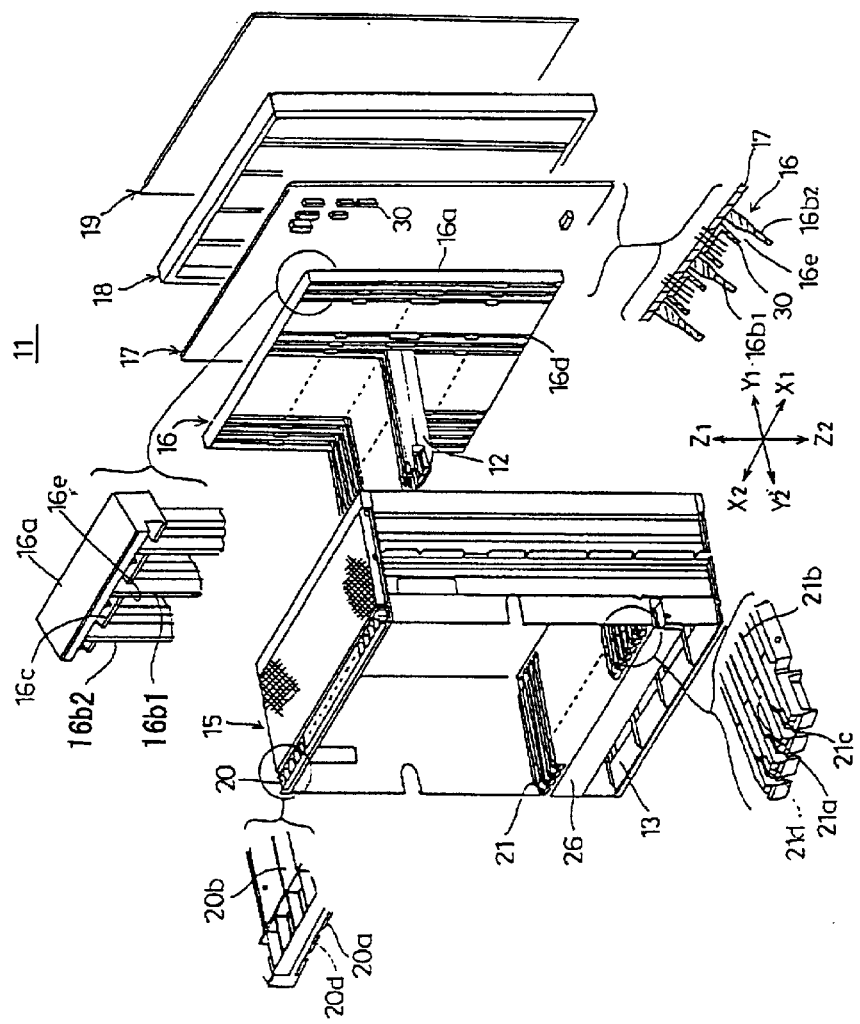
FIG. 2 is an exploded perspective view of a sub-rack unit according to the embodiment of the present invention.

FIG. 2 is an exploded perspective view of the sub-rack unit 11.

As shown in FIGS. 1 and 2, the sub-rack unit 11 has a frame plate 16 for a back wiring board, a back wiring board 17, a warp prevention frame 18 for a back wiring board, and a back cover 19 placed successively one on another on the back side of a square box part 15.

Figure 3:
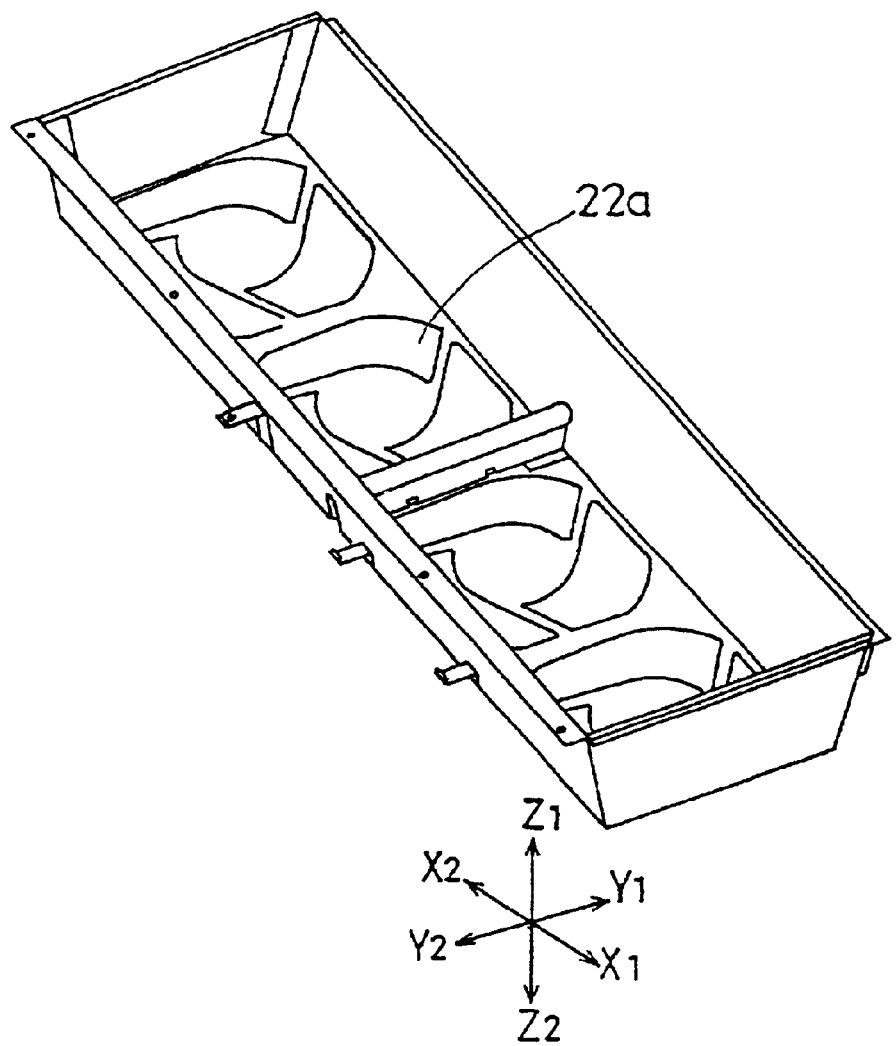
FIG. 3 is a diagram showing an air reservoir room forming member according to the embodiment of the present invention.

The square box part 15 has a roof plate 20 and a lower plate 21. The roof plate 20 and the lower plate 21 have guide rail parts 20a and 21a formed side by side thereon, respectively. The communication plug-in unit 40 or 120 is supported by a corresponding one of the guide rail parts 20a and a corresponding one of the guide rail parts 21a. Each guide rail part 20a and each guide rail part 21a have openings 20b and 21b formed therein for forced air-cooling, respectively. Each guide rail part 21a has a notch 21c formed in its $Y_2$ end. Each notch 21c is formed to prevent the communication plug-in unit 40 or 120 from being inserted unintentionally upside down into the sub-rack 11 to be mounted therein, and to let through an optical fiber. A box-like air reservoir room forming member 22 shown in FIG. 3 is attached under the lower plate 21 so that an air reservoir room 23 is formed to cover the entire lower plate 21. The air reservoir room forming member 21 has openings 22a corresponding to the motor-fan plug-in units 140 formed in its bottom side. The motor-fan plug-in unit housing parts 13 are formed under the air reservoir room forming member 22. An optical fiber duct 24 for leading the optical fibers is formed to extend in the $X_1$-$X_2$ direction (an X direction) on the $Y_2$ side of the air reservoir room forming member 22. A display device 25 for displaying a state of the communication device 10 is provided in a portion of the optical fiber duct 24. The optical fiber duct 24 is provided with a lid 26, which is usually closed to cover the front side of the optical fiber duct 24 as shown in FIG. 2.

The frame plate 16, which is made of aluminum by die casting, includes a square frame part 16a, numerous ribs 16b extending in the $Z_1$-$Z_2$ direction (a Z direction) and arranged side by side in the X direction, a horizontal rib part 16c on the $Z_1$ side, and a horizontal rib part 16d on the $Z_2$ side. Each two adjacent ribs 16b form a pair, and the horizontal rib portions 16c and 16d connect each two adjacent ribs 16b, respectively. For instance, in FIG. 2, adjacent ribs $16b_1$ and $16b_2$ form a pair, and a longitudinally narrow opening 16e is formed in a part surrounded by the ribs $16b_1$ and $16b_2$, and the horizontal rib portions 16c and 16d. The pair of the adjacent ribs $16b_1$ and $16b_2$ corresponds to one of the guide rail parts 20a and one of the guide rail parts 21a.

The base portion of each guide rail member 12 is fixedly inserted into a space formed between each corresponding pair of the ribs 16b so that the guide rail members 12 protrude in the $Y_2$ direction and are arranged side by side in the X direction on the frame plate 16. Each guide rail member 12 is provided to mount the small-size communication plug-in unit 200 in the sub-rack unit 11.

Numerous connectors 30 are attached to the front surface of the back wiring board 17, being arranged in lines in the Z direction and side by side in the X direction. Each connector 30 is positioned in each longitudinally narrow opening 16e of the frame plate 16.

A Structure of the Communication Plug-in Unit 40

Figure 4:
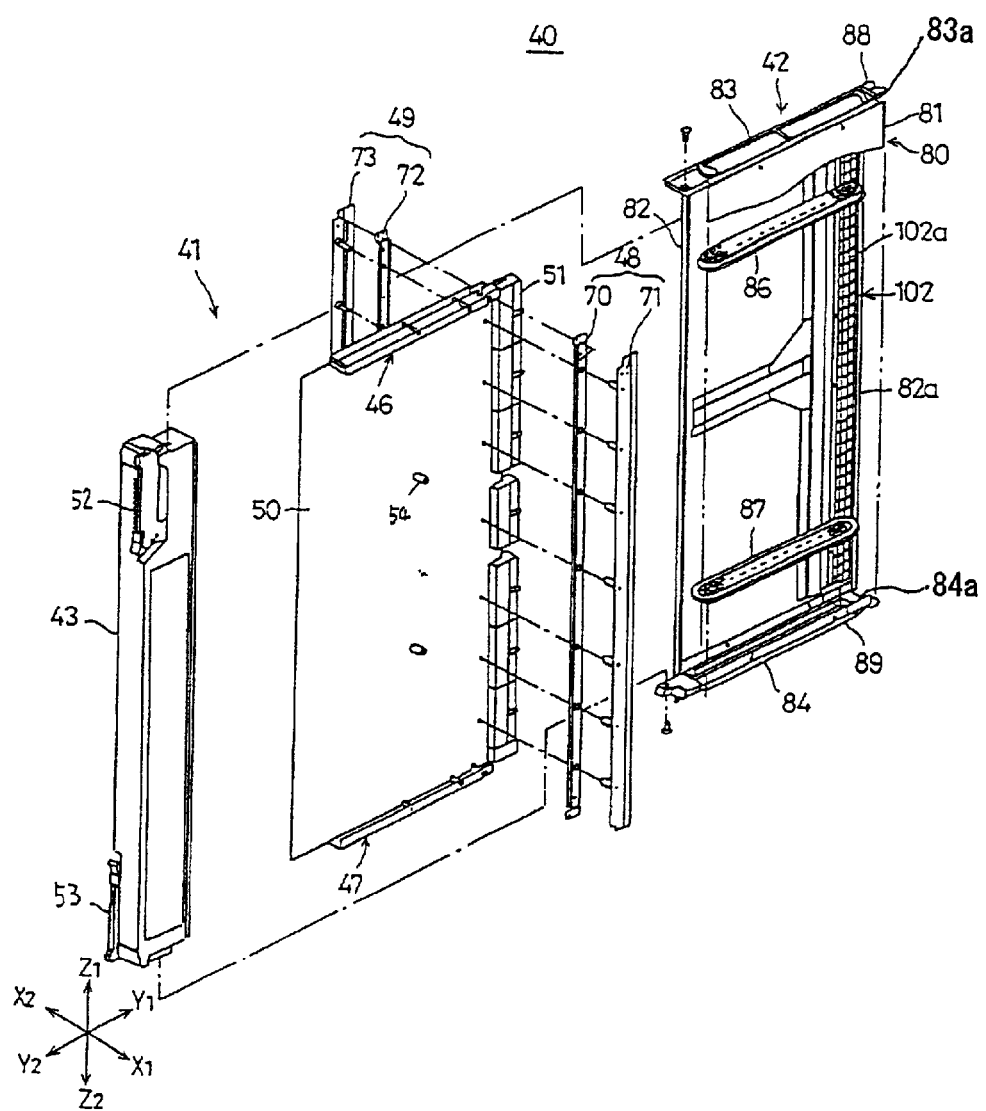
FIG. 4 is an exploded perspective view of a communication plug-in unit according to the embodiment of the present invention.

FIG. 4 is an exploded perspective view of the communication plug-in unit 40.

As shown in FIG. 4, the communication plug-in unit 40 includes a main body 41 and a case assembly 42 covering the main body 41.

Figure 5:
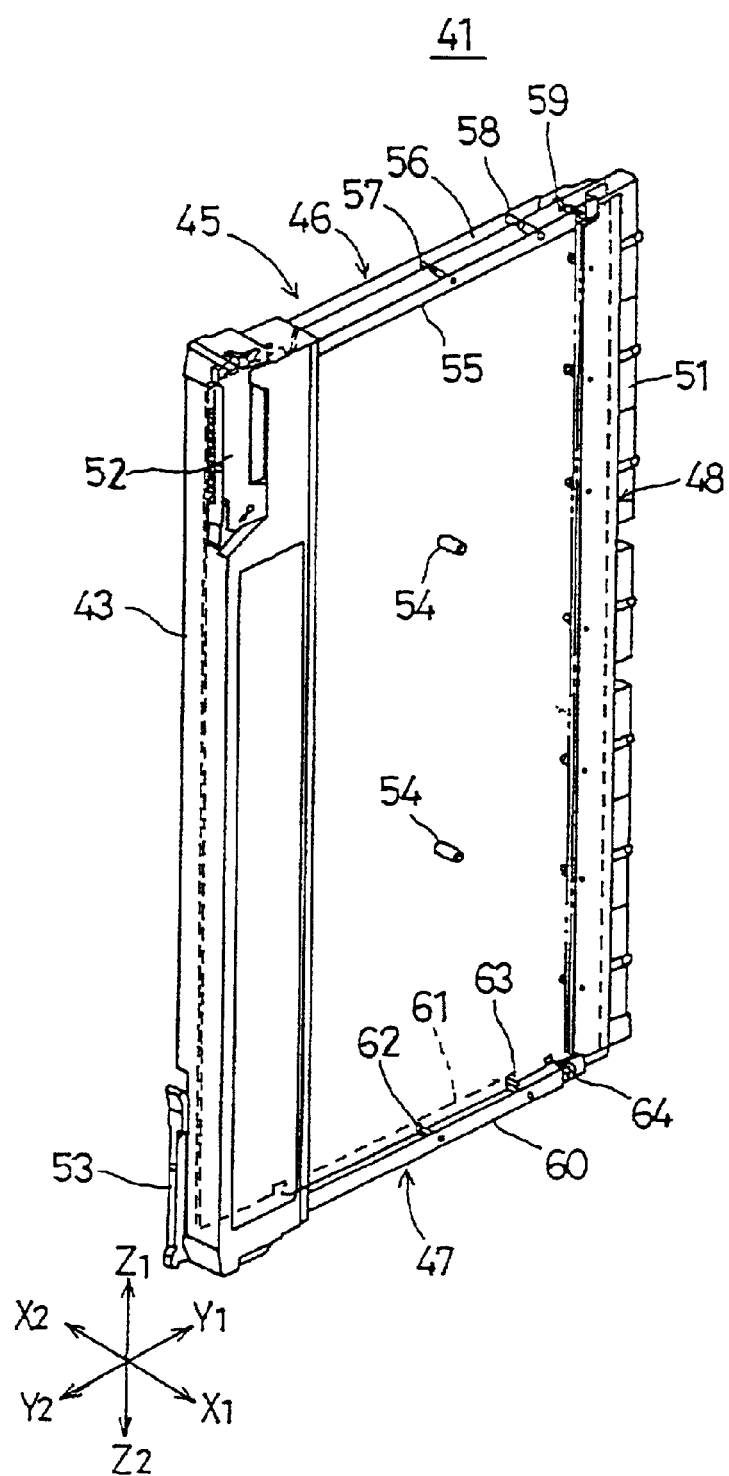
FIG. 5 is a diagram showing a main body of the communication plug-in unit of FIG. 4.

FIG. 5 is a diagram showing the main body 41 of the communication plug-in unit 40. The main body 41 includes a front member 43 made of aluminum by die casting shown in FIG. 7, a printed board assembly 44 shown in FIG. 6, upper and lower horizontal arm assemblies 46 and 47 extending in the $Y_1$ direction from the upper and lower ends of the front member 43, respectively, and vertical pillar assemblies 48 and 49 provided between the upper and lower horizontal arm assemblies 46 and 47 with the upper and lower ends of the respective vertical pillar assemblies 48 and 49 being joined to the $Y_1$ ends of the upper and lower horizontal arm assemblies 46 and 47, respectively. The front member 43, the upper and lower horizontal arm assemblies 46 and 47, and the vertical pillar assemblies 48 and 49 form a rectangular frame body 45. The printed board assembly 44 is housed in the frame body 45.

Figure 6:
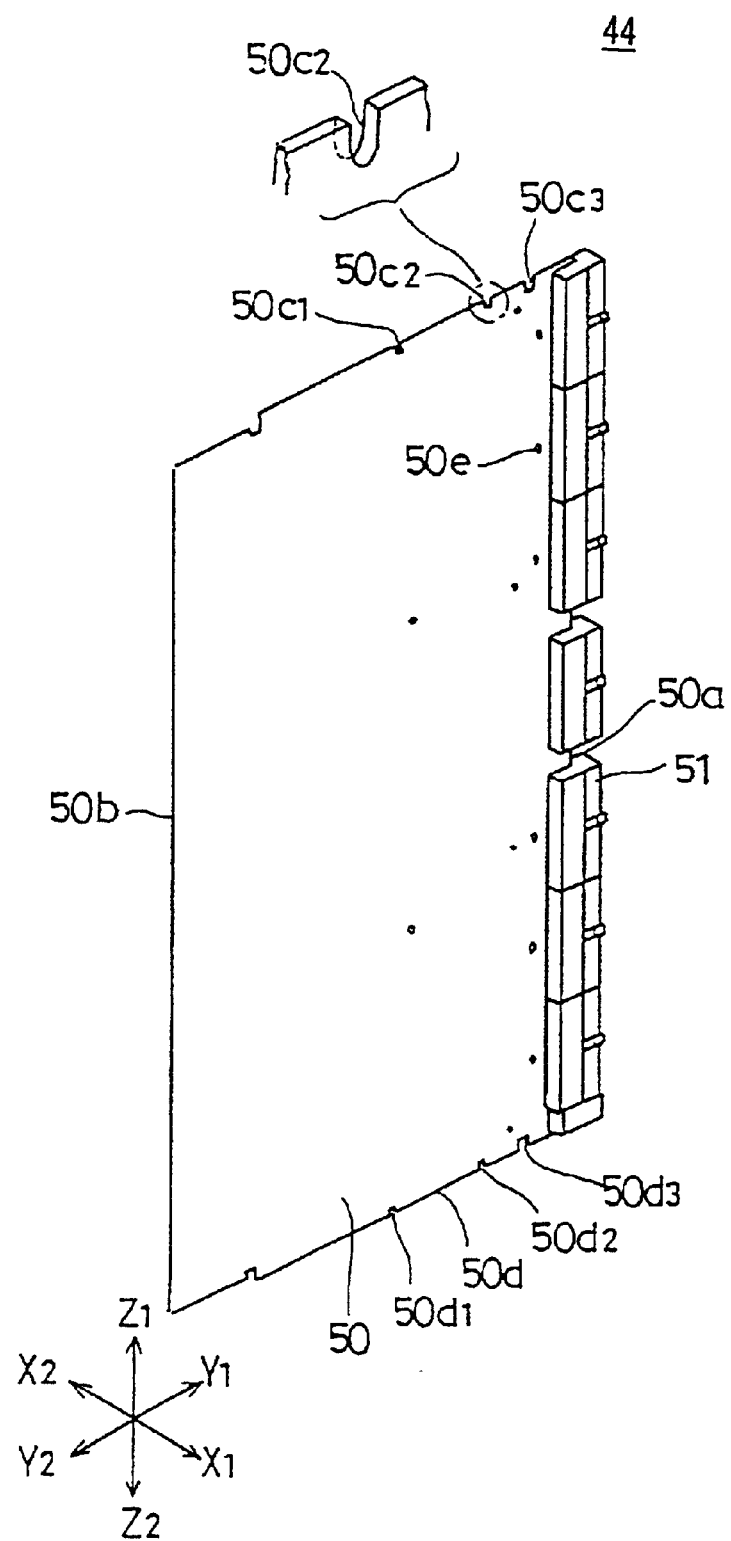
FIG. 6 is a perspective view of a printed board assembly included in the main body of FIG. 5.

FIG. 6 is a perspective view of the printed board assembly 44.

As shown in FIG. 6, the printed board assembly 44 includes a rectangular printed board 50 having a $Y_1$ side 50a in the $Y_1$ direction, a $Y_2$ side 50b in the $Y_2$ direction, an upper side 50c, and a lower side 50d. Electronic components (not shown) are provided to form an electronic circuit on a surface of the printed board 50. A plurality of bushings 54 for over-warp prevention are fixedly planted in the center of the surface of the printed board 50. Further, a plurality of connectors 51 are mounted side by side on the $Y_1$ side 50a thereof. The printed board 50 has three notch parts $50c_1$ through $50c_3$ on the upper side 50c thereof, as many notch parts $50d_1$ through $50d_3$ on the lower side 50d thereof, and a plurality of through holes 50e formed side by side in the Z direction in the proximity of the $Y_1$ side 50a.

Figure 7:
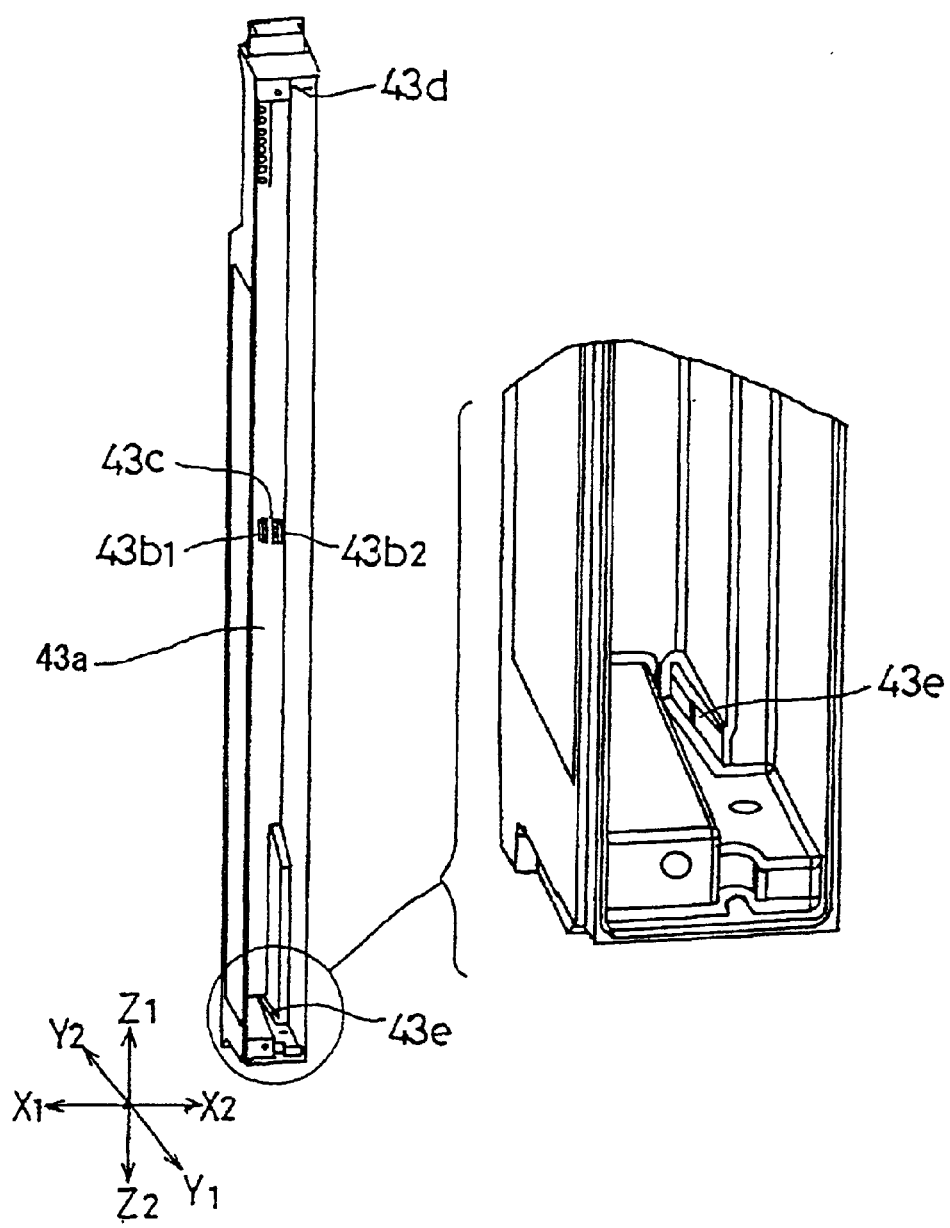
FIG. 7 is a rear side view of a front member included in the main body of FIG. 5.

FIG. 7 is a rear side view of the front member 43.

As shown in FIG. 7, the front member 43 is shaped like a box and has a space 43a formed therein with an opening on its rear side. A pair of convex parts $43b_1$ and $43b_2$ are formed in the center of the $Y_2$ inside face of the front member 43, and V-shaped concave groove parts 43d and 43e each protruding in the $Y_2$ direction are formed on the upper and lower inside faces of the front member 43, respectively. A groove part 43c is formed between the convex parts $43b_1$ and $43b_2$. Card lever assemblies 52 and 53 are attached to the upper and lower end portions of the front member 43, respectively, as shown in FIGS. 4 and 5.

As shown in FIG. 5, the upper horizontal arm assembly 46 has arm members 55 and 56 joined by pins 57 through 59 so as to have a ladder-like structure. Similarly, the lower horizontal arm assembly 47 has arm members 60 and 61 joined by pins 62 through 64 so as to have a ladder-like structure. The upper and lower horizontal arm assemblies 46 and 47 have their respective $Y_2$ ends screwed to the upper and lower ends of the front member 43, respectively.

As shown in FIG. 4, the vertical pillar assembly 48 includes a metal pillar member 70 and an insulating synthetic-resin cover member 71 fixed to the outside of the metal pillar member 70 by heat-caulking. The other vertical pillar assembly 49 also includes a metal pillar member 72 and an insulating synthetic-resin cover member 73 fixed to the outside of the metal pillar member 72 by heat caulking.

The vertical pillar assemblies 48 and 49 are provided in the Z direction between $Y_1$ tip portions of the upper and lower horizontal arm assemblies 46 and 47 to oppose the sides of the printed board 50 with their upper and lower ends fixed to the $Y_1$ tip portions of the upper and lower horizontal arm assemblies 46 and 47 by the above-described pins 59 and 64, respectively. The connectors 51 are positioned farther in the $Y_1$ direction on the printed board 50 than the vertical pillar assemblies 48 and 49.

Figure 8:
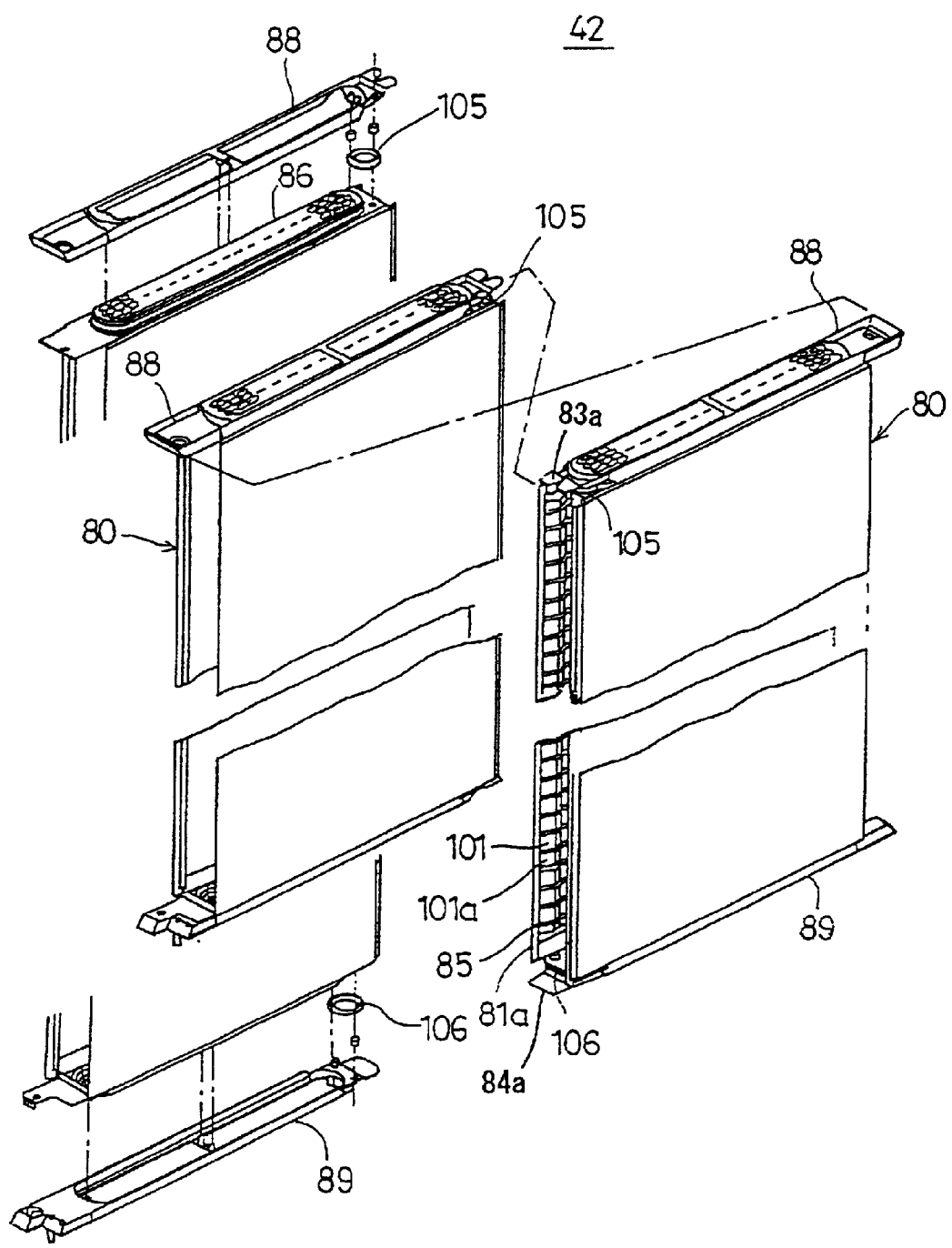
FIG. 8 is a perspective view of a case assembly included in the communication plug-in unit of FIG. 4.

FIG. 8 is a perspective view of the case assembly 42.

As shown in FIGS. 4 and 8, the case assembly 42 includes an aluminum case 80 that is a rectangular parallelepiped flat and long in the Z direction. The case 80 includes side plates 81 and 82, a roof (top) plate 83, and a bottom plate 84. The roof plate 83 and the bottom plate 84 have openings into which electromagnetic wave leakage restriction filters 86 and 87 are fitted, respectively. The case 80 has a rectangular opening 85 formed on its $Y_1$ side, and has edge parts 81a, 82a, 83a, and 84a facing the opening 85. The electromagnetic wave leakage restriction filters 86 and 87 are fitted into the openings of the roof plate 83 and the bottom plate 84 from the lower side of the roof plate 83 and the upper side of the bottom plate 84, respectively. Slider members 88 and 89 are attached to the upper surface of the roof plate 83 and the lower surface of the bottom plate 84, respectively.

The case assembly 42 covers the printed board assembly 44 as shown in FIG. 1 with the $Y_2$ ends of the slider members 88 and 89 being screwed to the upper and lower surfaces of the front member 43, respectively, as shown in FIG. 4. The tip portion of each connector 51 protrudes from the case assembly 42 in the $Y_1$ direction. The $Y_2$ end portion of the printed board assembly 44 fits into the front member 43. That is, the printed board assembly 44 is covered with the case assembly 42 and the front member 43 so as to restrict the outward leakage of electromagnetic waves therefrom by itself.

The communication plug-in unit 40 having the above-described structure is inserted into the sub-rack unit 11 with the slider members 88 and 89 being guided by the guide rail parts 20a and 21a to slide, respectively, and the connectors 51 are finally connected to the connectors 30 by operating the card lever assemblies 52 and 53.

Figure 9:
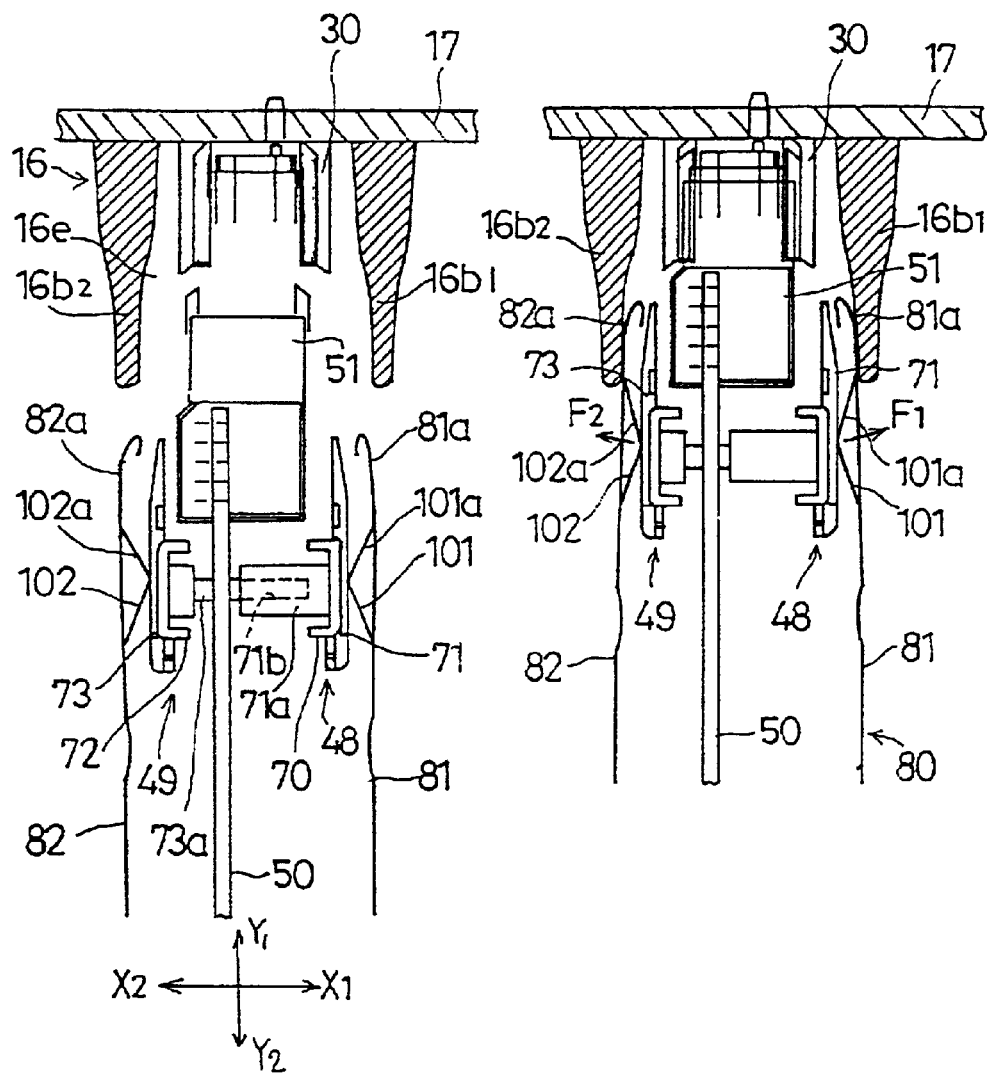
FIGS. 9A and 9B are diagrams for illustrating a mounted state of the communication plug-in unit of FIG. 4.

At this point, the $Y_1$ end portion of the case 80 is pressed to touch the frame plate 16 as shown in FIG. 9B so that the case 80 is electrically connected to ground via the frame plate 16, the sub-rack unit 11, the rack (not shown) to have frame ground potential. Thus, with the case 80 and the front member 43 covering the entire printed board assembly 44 and having the frame ground potential, the electromagnetic waves radiated from the electronic circuit formed on the printed board assembly 44 is shielded by the case 80 and the front member 43 so that the outward leakage of the electromagnetic waves is restricted in each communication plug-in unit 40. Therefore, the outward leakage of the electromagnetic waves from the communication device 10 is effectively restricted. Since the outward leakage of the electromagnetic waves is restricted in each communication plug-in unit 40, the mutual interference of the electromagnetic waves is prevented from being generated between or among the communication plug-in units 40 mounted in the sub-rack unit 11.

In FIG. 1, the small-size communication plug-in unit 200 is equal to the normal-size communication plug-in unit 40 in terms of structure except that the communication plug-in unit 200 is half of the communication plug-in unit 40 in height. Accordingly, the outward leakage of electromagnetic waves from the communication plug-in unit 200 is restricted in the sub-rack unit 11. The communication plug-in unit 120 is also equal to the communication plug-in unit 40 in terms of structure except for having the photoelectric conversion module 121. Therefore, the outward leakage of electromagnetic waves from the communication plug-in unit 120 is restricted in the sub-rack unit 11.

A Reinforced Structure of the Communication Device 10 Against EMI (1) FIGS. 9A and 9B are diagrams for illustrating a mounted state of the communication plug-in unit 40. As shown in FIGS. 4, 8, and 9A, leaf spring members 101 and 102 long and narrow in the Z direction are fixedly welded to the inside faces of the $Y_1$ edge parts 81a and 82a of the side plates 81 and 82 of the case 80, respectively. The leaf spring members 101 and 102 are formed of numerous leaf spring strips 101a and 102a each bent into a V-shape and densely arranged in the Z direction along the lengths of the leaf spring members 101 and 102, respectively. The top portions of each V-shaped leaf spring strip 101a and each V-shaped leaf spring strip 102a touch the vertical pillar assemblies 48 and 49, respectively.

Since the pillar members 70 and 72 of the vertical pillar assemblies 48 and 49 are made of metal and joined to each other at a plurality of points in the Z direction, the vertical pillar assemblies 48 and 49 have good strength in the X direction and are prevented from being bent when the resilient forces of the leaf spring strips 101a and 102a are exerted thereon, respectively. Each stepped pin part 73a protruding from the cover member 73 passes through a corresponding one of the through holes 50e formed in the printed board 50 to be inserted into a hole 71b of a corresponding one of pillar parts 71a protruding from the cover member 71 until each stepped pin part 73a touches the bottom of the hole 71b. Thus, the pillar members 70 and 72 are joined to each other.

The communication plug-in unit 40 changes from a state of FIG. 9A to a state of FIG. 9B to be mounted in the sub-rack 11 by. The $Y_1$ edge parts 81a and 82a of the side plates 81 and 82 of the case 80 are slightly bent inward to be inserted between the adjacent ribs $16b_1$ and $16b_2$. As the $Y_1$ edge parts 81a and 82a are bent, each leaf spring strip 101a and each leaf spring strip 102a are bent to generate forces $F_1$ and $F_2$ in directions to press the side plates 81 and 82 outward, respectively. Therefore, the side plates 81 and 82 are pressed against the ribs $16b_1$ and $16b_2$ by the forces $F_1$ and $F_2$ of each leaf spring strip 101a and each leaf spring strip 102a in addition to their own resilient forces, respectively. Thus, the end parts 81a and 82a securely contact the surfaces of the ribs $16b_1$ and $16b_2$ which surfaces oppose the end parts 81a and 82a, respectively, compared with a case in which the side plates 81 and 82 are pressed against the ribs $16b_1$ and $16b_2$ by the resilient forces of their own. This provides a shield against, for instance, an electromagnetic interference noise of a frequency as high as 10 GHz, not to mention electromagnetic interference noises of lower frequencies.

Figure 10:
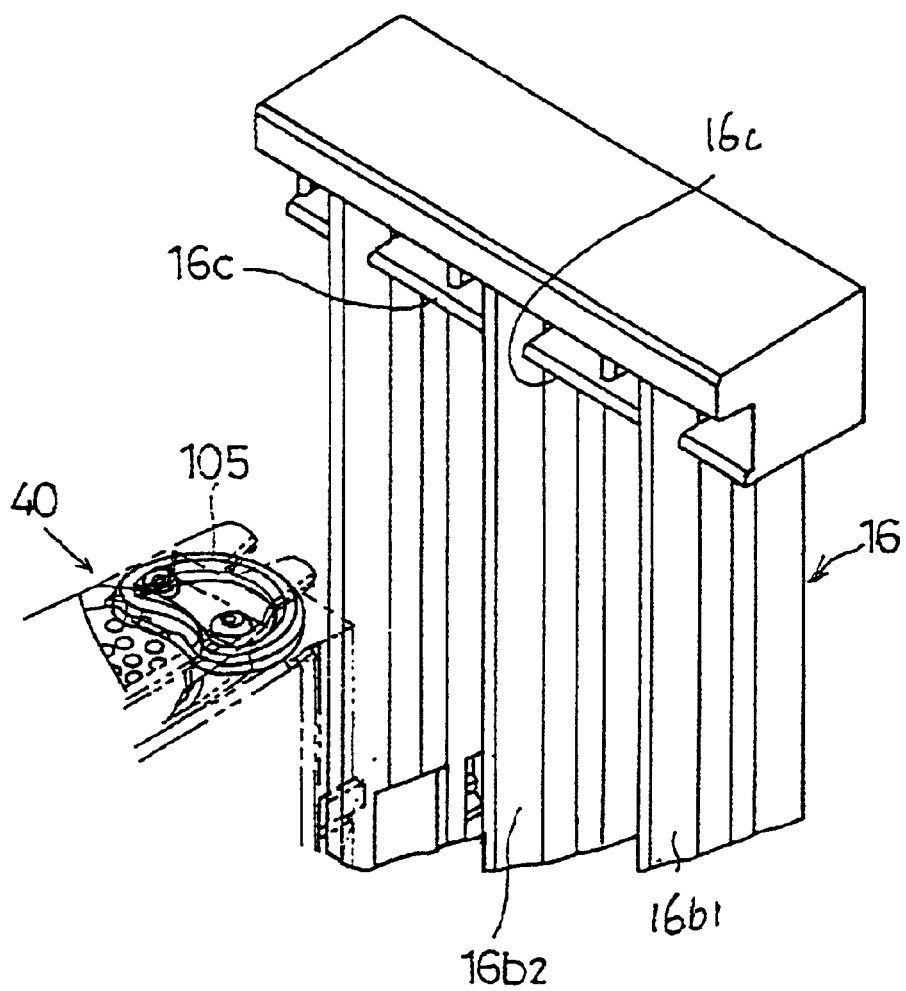
FIG. 10 is a diagram showing in parallel a shield member of the case assembly of FIG. 8 and a frame plate of the sub-rack unit of FIG. 2.

(2) As shown in FIG. 8, shield members 105 and 106 each having a ring-like shape and elasticity like a brush are provided on the roof plate 83 and the bottom plate 84 to protrude in the $Y_1$ direction from the $Y_1$ ends thereof, respectively. FIG. 10 is a diagram showing the shield member 105 and the frame plate 16 in parallel. As shown in FIGS. 8 and 10, the shield member 105 is provided in a narrow space between the slider member 88 and the roof plate 83 with its two points on its inner circumference portion being supported. Similarly, the shield member 106 is provided in a narrow space between the slider member 89 and the bottom plate 84 with its two points on its inner circumference portion being supported.

Figure 11:
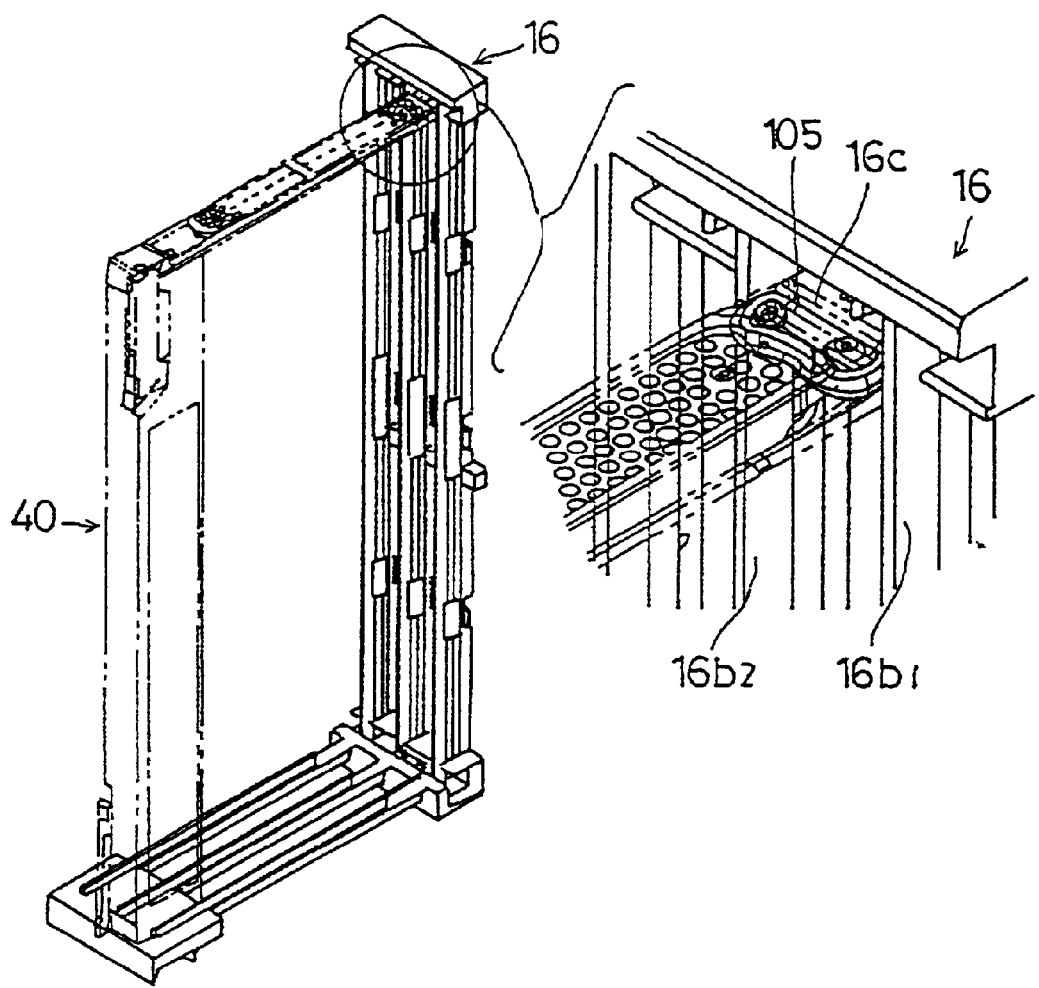
FIG. 11 is a diagram showing a state in which the shield member is pressed against the frame plate when the communication plug-in unit is mounted in the sub-rack unit.

FIG. 11 is a diagram showing a state in which the shield member 105 is pressed against the frame plate 16 when the communication plug-in unit 40 is mounted in the sub-rack unit 11.

When the communication plug-in unit 40 is mounted, as shown enlarged in FIG. 11, the shield member 105 is pressed against the horizontal rib part 16c and the ribs $16b_1$ and $16b_2$, and elastically deforms to be along the horizontal rib part 16c and the ribs $16b_1$ and $16b_2$. As a result, the shield member 105 is pressed onto the front surface of the horizontal rib part 16c and the ribs $16b_1$ and $16b_2$ by the elasticity of its own. Similarly, the shield member 106 is pressed onto the front surface of the horizontal rib part 16d and the ribs $16b_1$ and $16b_2$.

Therefore, a space between the frame plate 16 and the roof plate 83 of the case assembly 42 and a space between the frame plate 16 and the bottom plate 84 of the case assembly 42 are securely shielded.

Figure 12:
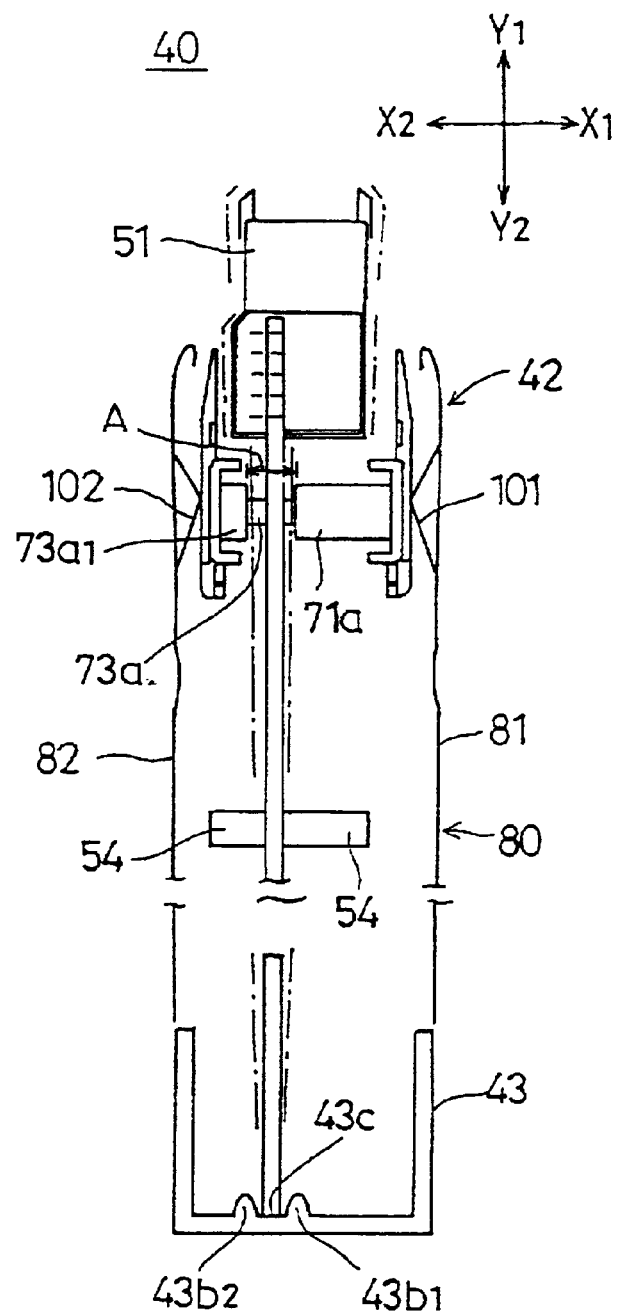
FIG. 12 is a diagram showing a relation between a printed board included in the printed board assembly of FIG. 6 and a case included in the case assembly of FIG. 8.

A Counter-EMI Structure of the Communication Device 10 Considering an Assembly Error FIG. 12 is a diagram showing a relation between the printed board 50 and the case 80 of the communication plug-in unit 40.

The communication plug-in unit 40 has a structure show in FIG. 12. The $Y_2$ side 50b of the printed board 50 is fitted into the groove part 43c and the concave groove parts 43d and 43e of the front member 43, and the through holes 50e formed in the proximity of the $Y_1$ side 50a of the printed board 50 are supported by the stepped pin parts 73a. Therefore, as indicated by a dot-dash line in FIG. 12, the printed board 50 is displaceable on the side of the $Y_1$ side 50a in the X direction within a range A between a step part $73a_1$ of each stepped pin part 73 and each pillar part 71a, being centered on the $Y_2$ side 50b. That is, the printed board 50 is loosely supported with respect to the case assembly 42 and the front member 43.

An assembly error is not avoidable in actually assembling the sub-rack unit 11. For instance, suppose that, in FIG. 9A, a position of the connector 30 with respect to the opening 16e is displaced slightly in the X direction from a required position due to an assembly error of the frame plate 16 and the back wiring board 17. In this case, the $Y_1$ side 50a of the printed board 50 is displaced in the X direction at the final stage of mounting the communication plug-in unit 40, that is, at the stage of fitting the connector 51 into the connector 30. This displacement is referred to as "an alignment displacement".

Here, if the printed board 50 is rigidly fixed to the case 80 and the front member 43, the $Y_1$ end of the case 80 is displaced in accordance with the alignment displacement. If the case 80 is displaced in the $X_1$ ($X_2$) direction, the end part 82a (81a) is pressed onto the rib $16b_2$ ($16b_1$) with weaker force so that the shield is impaired.

However, since the printed board 50 is loosely supported with latitude with respect to the case assembly 42 and the front member 43 in this embodiment, the case 80 is not displaced even though the above-described alignment displacement occurs. Therefore, the side plates 81 and 82 of the case 80 remain uniformly pressed against the ribs $16b_1$ and $16b_2$, respectively, and the shields for a space between the frame plate 16 and the side plate 81 and a space between the frame plate 16 and the side plate 82 are prevented from being impaired.

In the communication plug-in unit 40, the printed board 50 is also loosely supported with latitude in the Z direction with respect to the case 80. Therefore, even if a position of the connector 30 with respect to the opening 16e is displaced slightly in the Z direction from the required position, the above-describe alignment displacement does not cause the case 80 to be displaced. This prevents the shield members 105 and 106 from being displaced in contacting the front surfaces of the horizontal rib parts 16c and 16d, respectively, so that the shield members 105 and 106 normally contact the front surfaces of the horizontal rib parts 16c and 16d, respectively. Thus, the shields for the space between the frame plate 16 and the roof plate 83 and the space between the frame plate 16 and the bottom plate 84 are prevented from being impaired.

Force Exertion in Mounting the Communication Plug-in Unit 40

Figure 13:
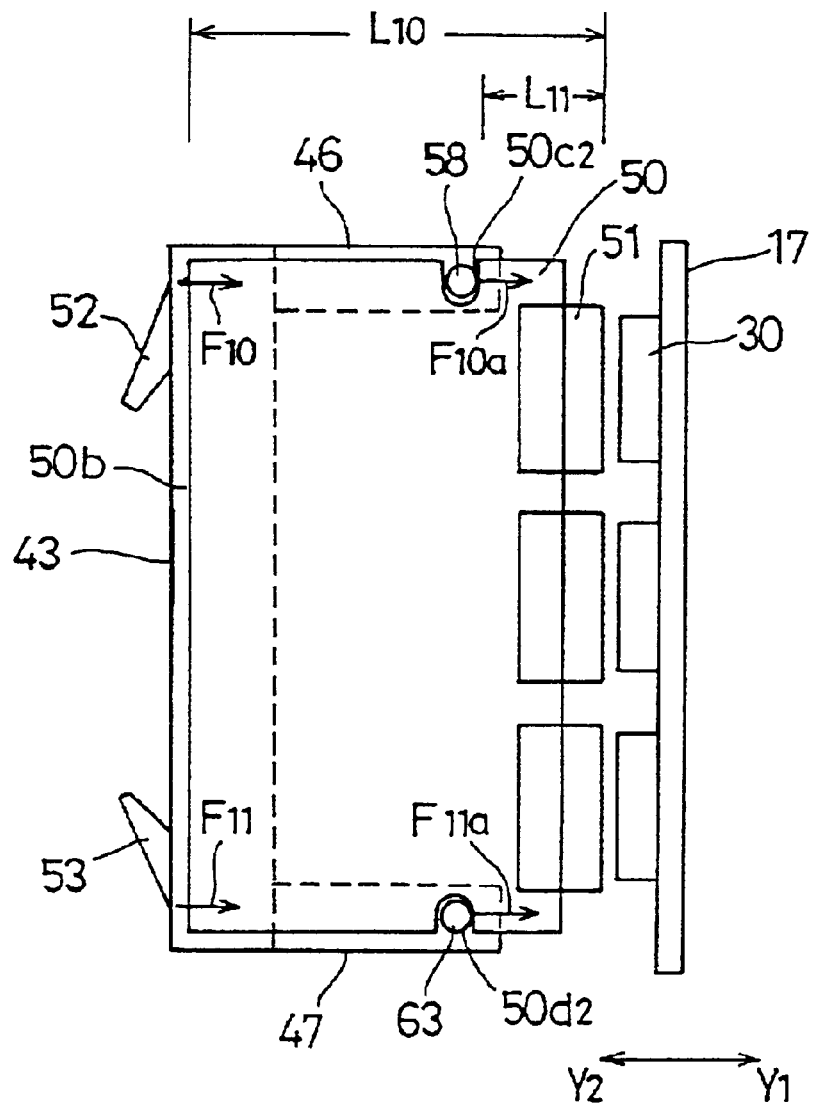
FIG. 13 is a diagram for illustrating force generation and exertion in operating card lever assemblies at a final stage of mounting the communication plug-in unit.

FIG. 13 is a diagram for illustrating force generation and exertion in operating the card lever assemblies 52 and 53 at the final stage of mounting the communication plug-in unit 40.

The upper and lower horizontal arm assemblies 46 and 47 extend in the $Y_1$ direction from the upper and lower ends of the front member 43, respectively. A pin 58 on the upper horizontal arm assembly 46 fits into the notch part $50c_2$ of the printed board 50, and a pin 63 on the lower horizontal arm assembly 47 fits into the notch part $50d_2$ of the printed board 50.

The operations of the card lever assemblies 52 and 53 generate forces $F_{10}$ and $F_{11}$ in the $Y_1$ direction in the upper and lower end portions of the front member 43, respectively. The force $F_{10}$ is transmitted via the upper horizontal arm assembly 46 and the pin 58 so that a pressing force $F_{10}a$ in the $Y_1$ direction is exerted on a point where the notch part $50c_2$ is formed. The force $F_{11}$ is transmitted via the lower horizontal arm assembly 47 and the pin 63 so that a pressing force $F_{11}a$ in the $Y_1$ direction is exerted on a point where the notch part $50d_2$ is formed. Thereby, the connectors 51 are connected with the connectors 30.

When the connectors 51 are connected with the connectors 30, the printed board 50 receives strong resistance from the back wiring board 17 on where the connectors 51 are provided. If the $Y_2$ side 50b of the printed board 50 is pressed, mounting forces are exerted on the printed board 50 at points away from where the connectors 51 are provided in the $Y_1$-$Y_2$ direction (a Y direction) by a distance $L_{10}$. Therefore, the operations of the card lever assemblies 52 and 53 may cause the printed board 50 to be curved by buckling. The curvature of the printed board 50 may cause debonding of the soldered parts of the terminals of IC elements mounted on the printed board 50.

However, in the communication plug-in unit 40 of this embodiment, the pressing forces $F_{10}a$ and $F_{11}a$ toward inside the sub-rack unit 11 are exerted on the points where the notch parts $50c_2$ and $50d_2$ are formed in the printed board 50. The points where the notch parts $50c_2$ and $50d_2$ are formed are away from the connectors 51 in the Y direction by a short distance $L_{11}$. This prevents the buckling of the printed board 50 from being caused. Therefore, the curvature of the printed board 50 is avoided, thus preventing the IC elements from being imperfectly mounted on the printed board 50. As a result, the communication plug-in unit 40 is mounted in the sub-rack unit 11 with good reliability.

If the printed board 50 is caused to warp, the bushings 54 planted in the center of the surface of the printed board 50 contact the side plates 81 and 82 of the case 80 so as to prevent the printed board 50 from warping any further, thus restricting the contacts of the mounted IC elements with the side plate 81 of the case 80.

A Prevention Mechanism of an Incorrectly Oriented Mounting of the Communication Plug-in Unit 40

Figures 14A, 14B:
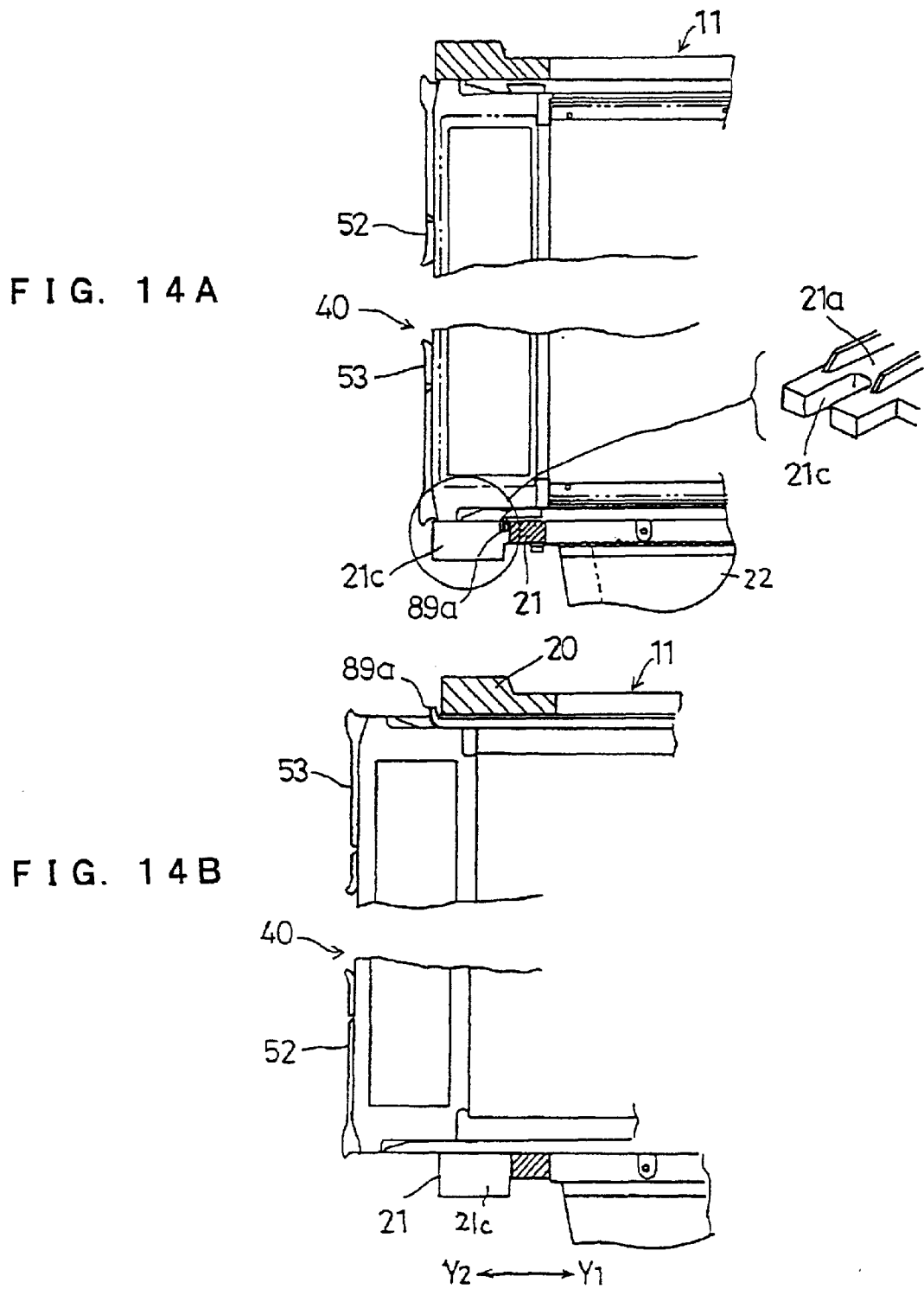
FIGS. 14A and 14B are diagrams for illustrating a prevention mechanism of an incorrect mounting of the communication plug-in unit.

FIGS. 14A and 14B are diagrams for illustrating the prevention mechanism of an incorrect mounting of the communication plug-in unit 40.

The communication plug-in unit 40, which has a flat box-like shape, may unintentionally be inserted upside down into the sub-rack unit 11 to be mounted therein. In this case, the connectors 51 of the communication plug-in unit 40 are not fitted into the connectors 30 of the sub-rack unit 11, the connectors 51 collide with the connectors 30 so that the connectors 51 and/or the connectors 30 may be damaged.

Therefore, in order to prevent such an accident, as shown in FIG. 14A, the communication plug-in unit 40 has a convex part 89a on the $Y_2$ end of the lower slider member 89, and the sub-rack unit 11 has the notch 21c formed in the $Y_2$ end of each lower guide rail part 21a.

As shown in FIG. 14A, the communication plug-in unit 40 is inserted into the sub-rack unit 11 until a predetermined position and is normally mounted in the sub-rack unit 11 with the convex part 89a being fitted into the notch 21c.

If the communication plug-in unit is to be unintentionally plugged upside down into the sub-rack unit 11 to be mounted therein, as shown in FIG. 14B, the convex part 89a of the slider member 89, which is positioned on the upside in this case, collides with the upper guide rail part 20a so as to prevent a further insertion of the communication plug-in unit 40 into the sub-rack unit 11. Therefore, the insertion of the communication plug-in unit 40 is prevented before its final stage, thus preventing the connectors 30 and/or the connectors 51 from being damaged.

A Structure of the Communication Plug-in Unit Against Static Electricity

If a charged user holds the communication plug-in unit 40, static electrical discharge may occur between the user and the metal case 80.

If the entire vertical pillar assemblies 48 and 49 are electrically conductive, very low currents each having a high voltage flow through the leaf spring members 101 and 102 to the vertical pillar assemblies 48 and 49, respectively. Then, the currents discharge to and flow through the leads of the connectors 51 provided in the very close proximity of the vertical pillar assemblies 48 and 49, and further flows via the pattern of the printed board 50 to the IC elements provided thereon. This may cause malfunctions of the IC elements.

Therefore, in order to avoid such a danger, as shown in FIGS. 4 and 9A, the vertical pillar assemblies 48 and 49 externally includes insulating synthetic-resin cover members 71 and 72, respectively, so that the leaf spring members 101 and 102 provided inside the case 80 contact the cover members 71 and 72, respectively.

Therefore, even if static electrical discharge occurs between the user and the metal case 80, very low currents each having a high voltage are prevented from flowing through the vertical pillar assemblies 48 and 49, respectively. Accordingly, the very low currents each having a high voltage generated by the static electrical discharge are prevented from flowing through the IC elements provided on the printed board 50. This prevents the IC elements from malfunctioning and provides the communication plug-in unit 40 with high reliability.

The Communication Plug-in Unit 120 Including the Photoelectric Conversion Module 121

Figure 15:
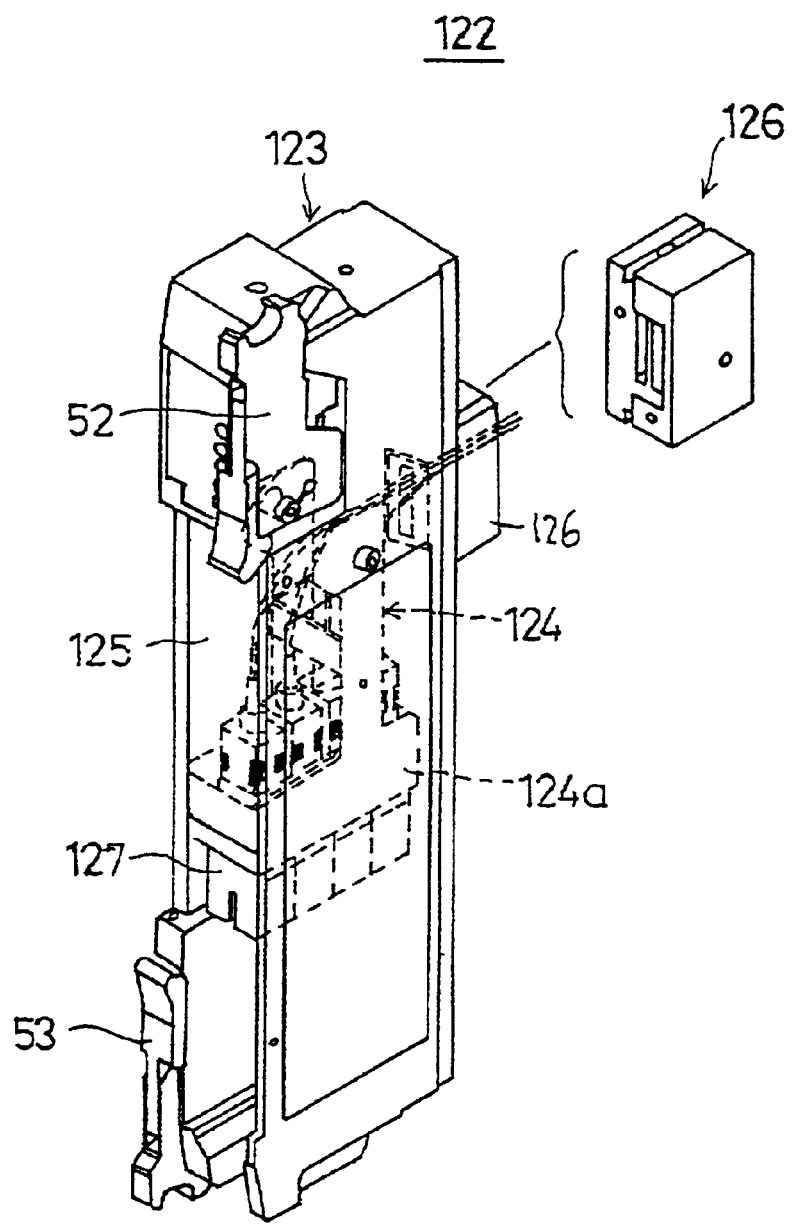
FIG. 15 is a perspective view of a front assembly of a communication plug-in unit including a photoelectric conversion module according to the embodiment of the present invention.
Figure 16:
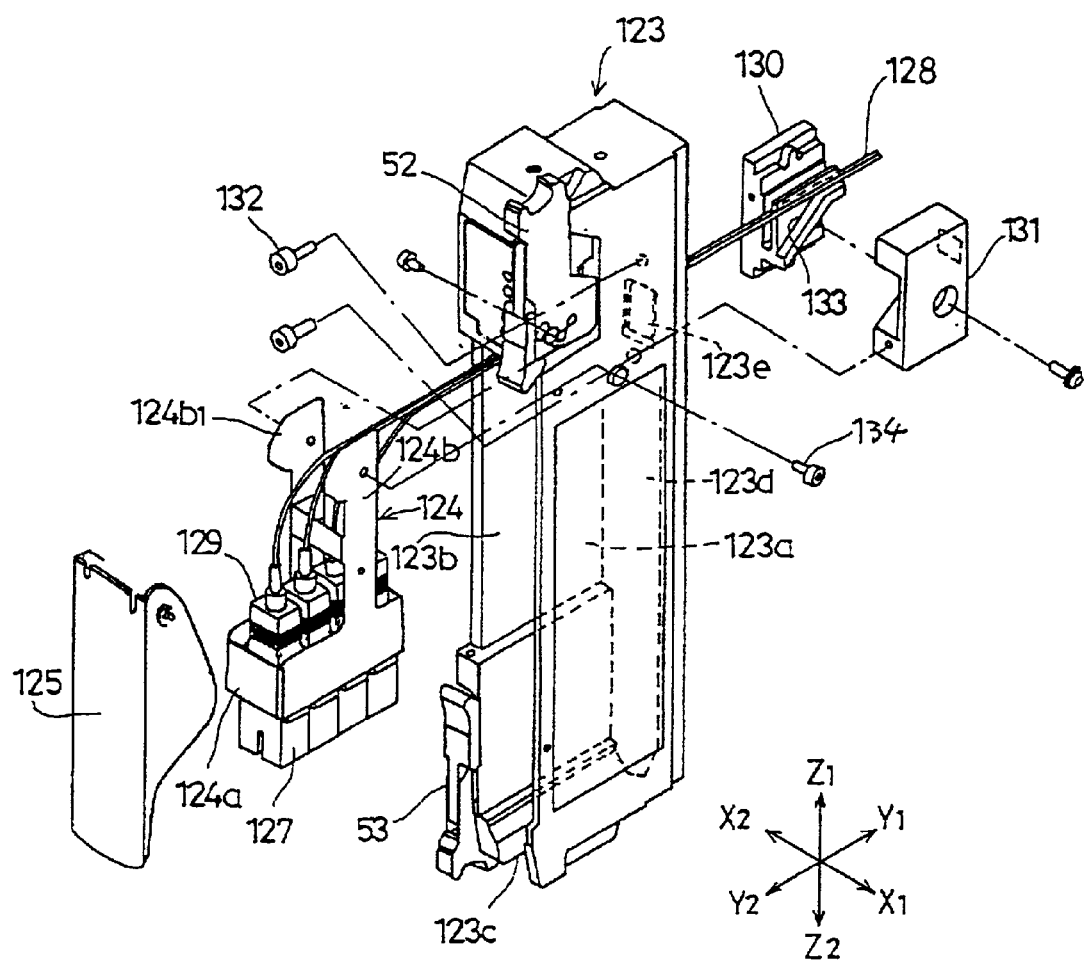
FIG. 16 is an exploded perspective view of the front assembly of FIG. 15.

The communication plug-in unit 120 including the photoelectric conversion module 121 includes a front assembly 122 shown in FIGS. 15 and 16. FIGS. 15 and 16 are a perspective view and an exploded perspective view of the front assembly 122, respectively. The front assembly 122 includes a front member 123, the card lever assemblies 52 and 53, an adapter-holding rotating member 124, a protector 125, and an optical fiber path block assembly 126.

The front member 123 is substantially a long and narrow rectangular parallelepiped and includes an internal space 123a, a front opening 123b, and a bottom opening 123c. The front and bottom openings 123b and 123c are coupled. A backside wall 123d of the front member 123 has an opening window 123e formed therein, which is sufficiently large so that each of later-described plugs 129 passes therethrough.

Figure 17:
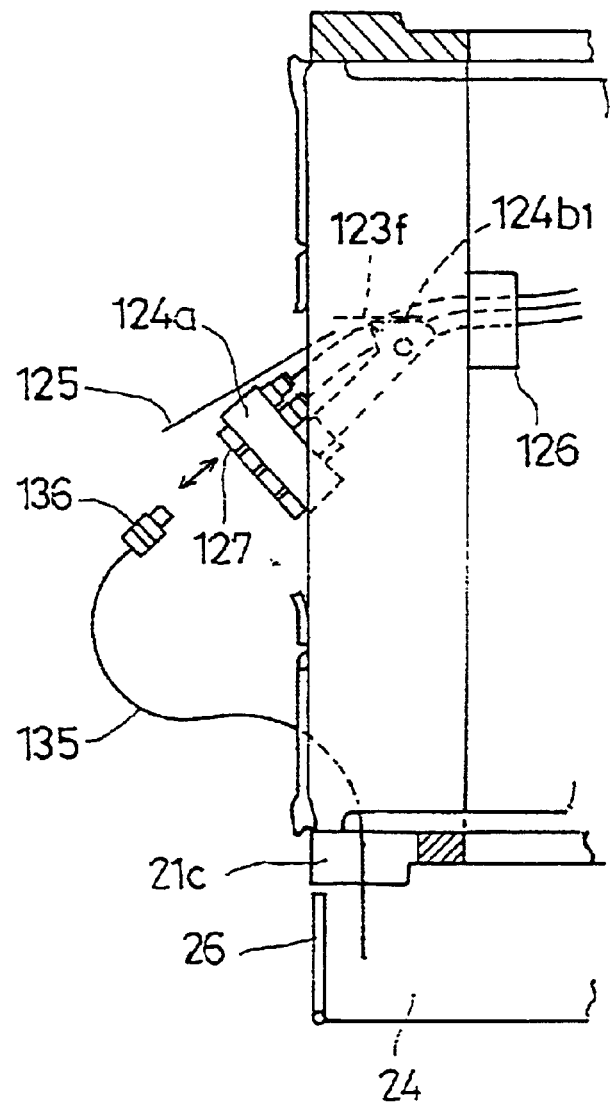
FIG. 17 is a diagram for illustrating an operation of mounting the communication plug-in unit including the photoelectric conversion module.

FIG. 17 is a diagram for illustrating an operation of mounting the communication plug-in unit 120.

The adapter-holding rotating member 124 includes an adapter-holding frame part 124a on which four connection adapters 127 for an optical connector are held side by side, and has an arm part 124b thereof supported by a pin 134 so as to rotationally move between a position shown in FIG. 15 and a position shown in FIG. 17. Conventionally, the number of the connection adapters 127 is less than four. The adapter-holding rotating member 124 is usually housed in the internal space 123a of the front member 123 as shown in FIG. 15, and is rotationally moved to have the connection adapters 127 appear in front of the front member 123 as shown in FIG. 17 in the case of a plug connection. In the position shown in FIG. 17, the connection adapters face slantingly downward. The adapter-holding rotating member 124 is allowed to include the four connection adapters 127 that are more than conventionally included because the adapter-holding frame part 124a is provided to be rotationally moved. In the position shown in FIG. 17, a protrusion part $124b_1$ protruding from the arm part 124b contacts a convex part 123f formed inside the front member 123 so as to prevent the adapter-holding rotating member 124 from being moved clockwise, that is, in a direction to face forward, from the position shown in FIG. 17.

Each plug 129 provided on an end of a corresponding one of optical fibers 128 withdrawn from the photoelectric conversion module 121 to pass through the opening window 123e is connected to the upper portion of a corresponding one of the connection adapters 127.

The protector 125 is attached to the front member 123 so as to close the front opening 123b and to be rotationally moved. When the adapter-holding rotating member 124 is rotationally moved to the position shown in FIG. 17, the protector 125 is in a state shown in FIG. 17 to cover the front side of the adapter-holding rotating member 124. The protector 125 protects a portion of each optical fiber 128 which portion extends inside the front member 123 from the corresponding plug 129 by preventing a user handling the communication plug-in unit 120 from touching the extending portion of each optical fiber 128 with her/his fingers. Further, the protector 125 also serves to protect the eyes of the user when the user connects each plug 136 provided on an end of a corresponding one of optical fibers 135 extending to external facilities with the lower portion of a corresponding one of the connection adapters 127.

The optical fiber block path assembly 126 includes first and second aluminum portions 130 and 131 combined so as to sandwich the optical fibers 128, and is fixed to the backside wall 123d of the front member 123 with screws 132 to cover the opening window 123e. In the optical fiber block path assembly 126, a path 133 long and narrow in the Y direction is formed so that the optical fibers 128 pass therethrough. This restricts the leakage of electromagnetic interference waves generated inside the communication plug-in unit 120 through the path 133 of the optical fibers 128 to the outside.

In order to connect the plugs 136 provided on the ends of the optical fibers 135 extending from the external facilities with the lower portions of the connection adapters 127, as shown in FIG. 17, the user pulls out the adapter-holding frame part 124a toward herself/himself with the communication plug-in unit 120 being mounted in the sub-rack unit 11. At this point, the connection adapters 127 face slantingly downward and are covered with the protector 125. Therefore, during this plug connection operation, the eyes of the user are protected from a laser beam emitted from an end of each plug 129.

FIG. 18 is a diagram showing a state in which the communication plug-in unit 120 is mounted in the sub-rack unit 11.

After the user is through with connecting the plugs 136 with the connection adapters 127, the adapter-holding frame part 124a is housed in the front member 123 to be in the state shown in FIG. 18. The optical fibers 135 extending in the $Z_2$ direction from the plugs 136 connected with the connection adapters 127 pass through the bottom opening 123c and the notch 21c of the guide rail part 21a into the optical fiber duct 24. Therefore, the optical fibers 135 extending to the external facilities are laid down smoothly.

A Forced Air-cooling Mechanism for the Communication Plug-in Unit 120

Figure 19:
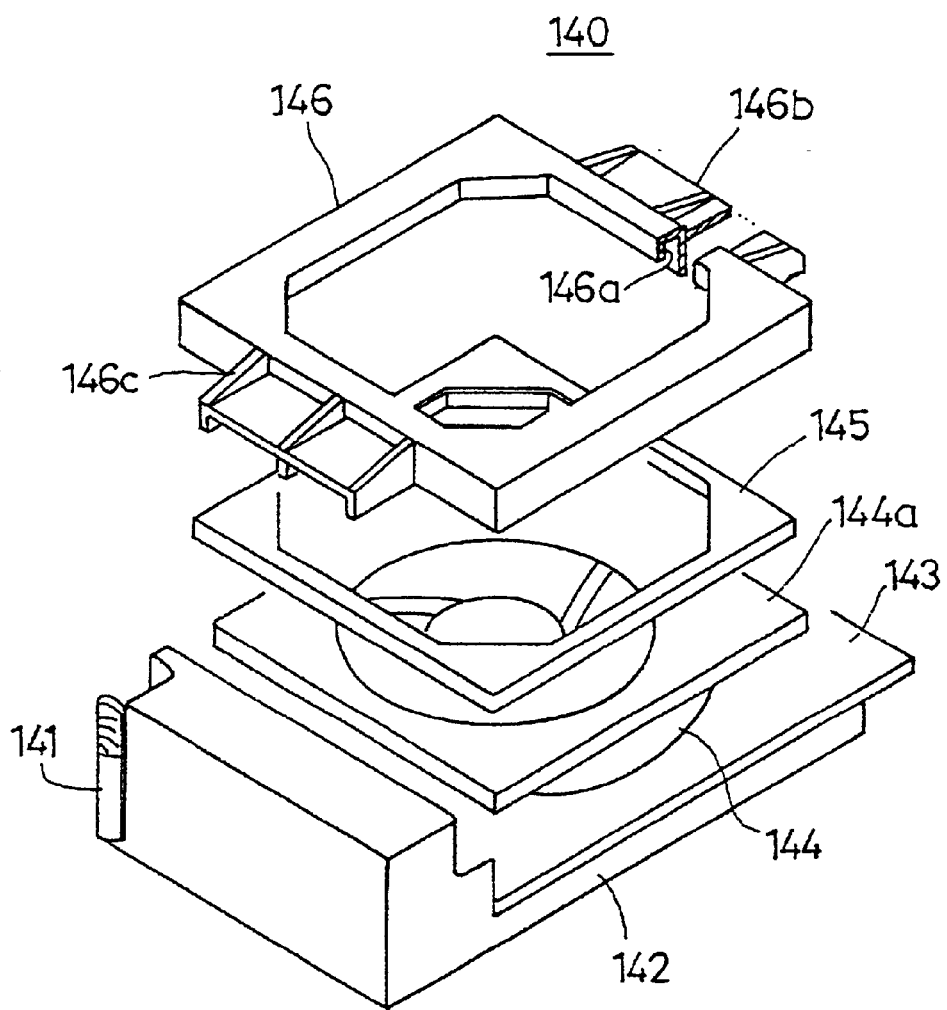
FIG. 19 is an exploded perspective view of a motor-fan plug-in unit according to the embodiment of the present invention.

FIG. 19 is an exploded perspective view of the motor-fan plug-in unit 140. FIGS. 20A through 20C are a top plan view, an $X_1$ side view, and a front ($Y_2$) side view of the motor-fan plug-in unit 140, respectively.

The motor-fan plug-in unit 140 includes a skeleton base 142 to which a card lever assembly 141 is attached. A printed board 143 and a motor fan 144 are fixed on the skeleton base 142. A square-frame-like packing 145 is placed on the upper surface of an upper plate 144a of the motor fan 144, and a square-frame-like lid member 146 is loosely attached to cover the upper plate 144a. The packing 145 is fitted into a groove part 146a formed on the bottom surface of the lid member 146 to be housed therein. The lid member 146 includes a projection part 146b projecting in the $Y_1$ direction from the $Y_1$ side of the lid member 146 and a projection part 146c projecting in the $Y_2$ direction from the $Y_2$ side of the lid member 146. The projection part 146b has ribs provided on its upper surface. The upper surface of each rib is tilt downward in the $Y_1$ direction. The projection part 146c has ribs provided on its upper surface. The upper surface of each rib is tilt downward in the $Y_2$ direction.

The motor-fan plug-in unit 140 is provided with a plug-in unit structure in case of future replacement due to the end of life of the motor fan 144.

Figure 21:
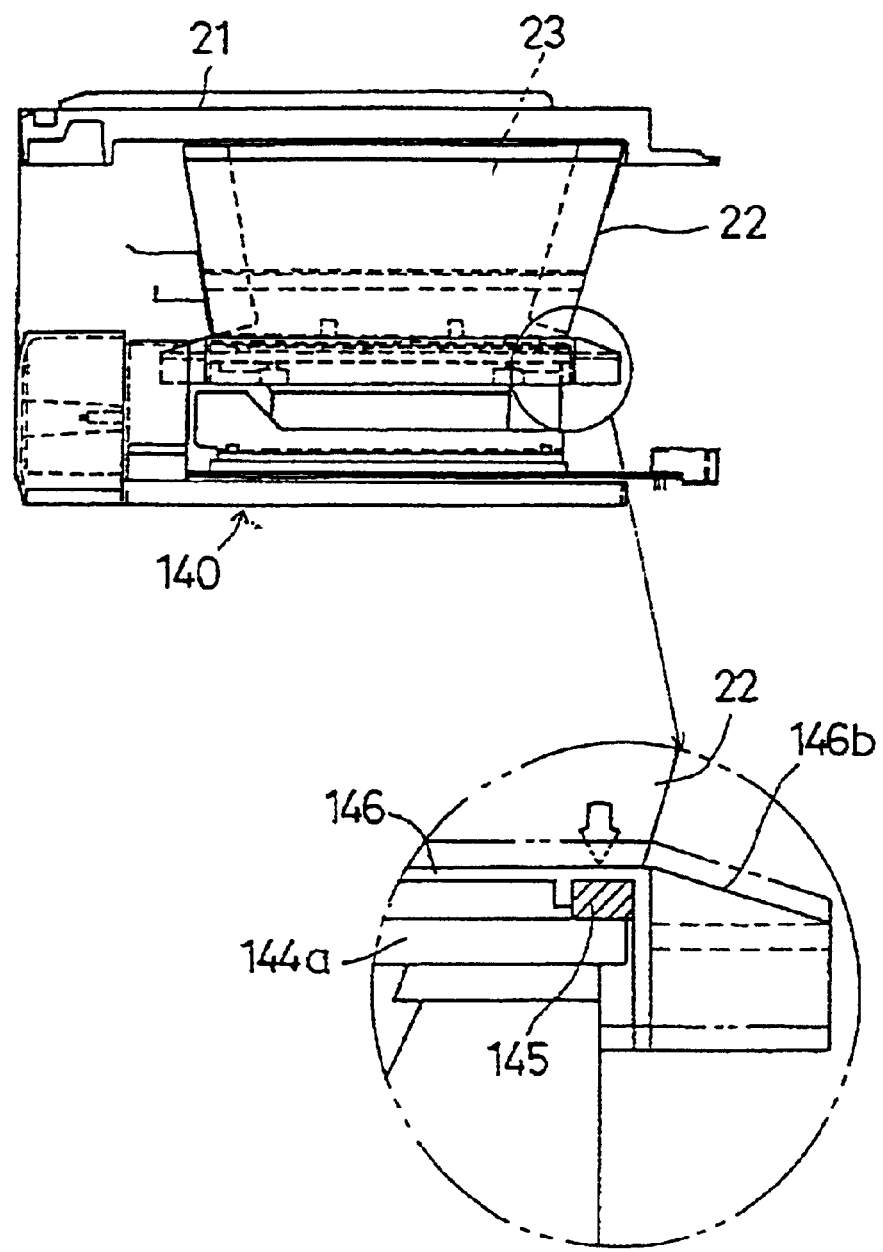
FIG. 21 is a diagram showing a mounted state of the motor-fan plug-in unit.
Figure 22:
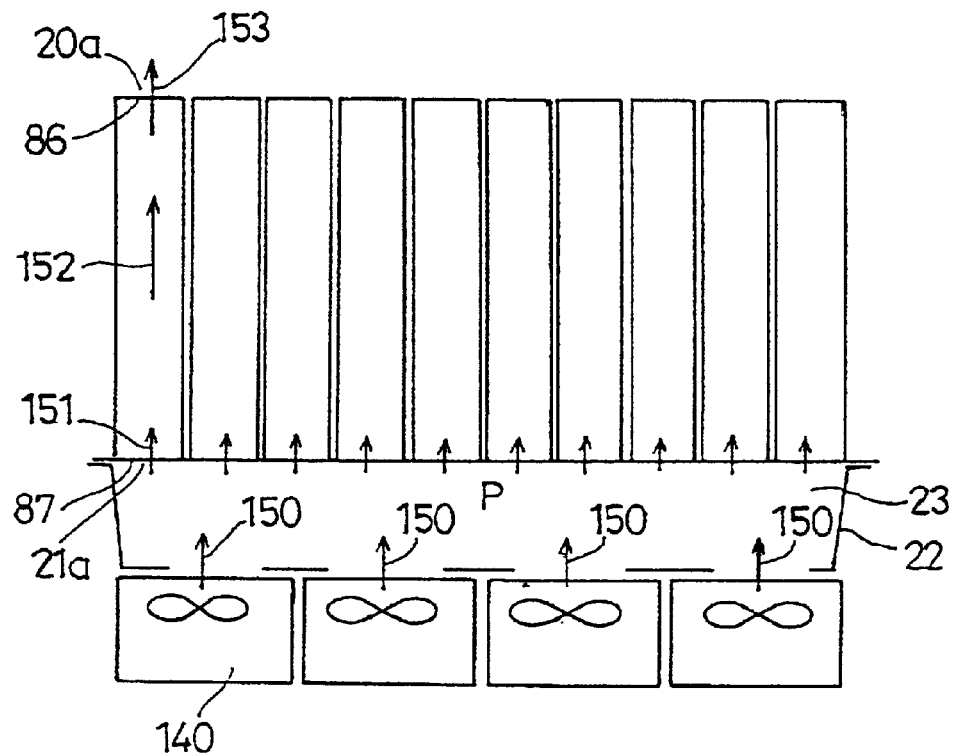
FIG. 22 is a diagram for illustrating forced air-cooling.

FIG. 21 is a diagram showing a mounted state of the motor-fan plug-in unit 140, in which state the motor-fan plug-in unit 140 is inserted in the $Y_1$ direction into the corresponding motor-fan plug-in unit housing part 13 formed in the lower portion of the sub-rack unit 11. FIG. 22 is a diagram for illustrating forced air-cooling.

As shown in FIG. 21, the motor-fan plug-in unit 140 is guided by the projection part 146b to be inserted into the motor-fan plug-in unit housing part 13 formed under the air reservoir room forming member 22. During this insertion process, the packing 145 is compressed to be pressed onto the upper plate 144a, and the lid member 146 is pressed against the lower surface of the air reservoir room forming member 22. This prevents the airflow from leaking out between the motor-fan plug-in unit 140 and the air reservoir room forming member 22. Therefore, as shown in FIG. 22, the airflow generated by the four driven motor-fan plug-in units 140 is effectively utilized for the forced air-cooling of the communication plug-in units 120 without loss.

The airflow enters the air reservoir room 23 as indicated by arrows 150 in FIG. 22, so that air in the air reservoir room 23 has a pressure P higher than the atmospheric pressure. The air of the pressure P flows equally into and blows up in each communication plug-in unit 120 arranged in the sub-rack unit 11. Therefore, all the communication plug-in units 120 are forcibly air-cooled equally.

As indicated by each arrow 151, the air of the pressure P enters each case 80 through the opening 21b of each corresponding guide rail part 21a of the sub-rack unit 11 and the electromagnetic wave leakage restriction filter 87 of the bottom plate 84 of each case 80. Then, as indicated by an arrow 152, the air flows in each case 80 along the surface of the printed board assembly 44 to remove heat therefrom, and as indicated by an arrow 153, flows out of each case 80 through the electromagnetic wave leakage restriction filter 86 of the roof plate 83 of each case 80. Thereafter, the air flows through the opening 20b of each corresponding guide rail part 20a of the sub-rack unit 11 to blow upward from the roof plate 20 of the sub-rack unit 11.

If the number of the communication plug-in units 120 to be mounted in the sub-rack unit 11 is small so as to leave an empty space therein, the filler plug-in unit 160 is mounted in the space. Airflow passes through inside the filler plug-in unit 160 having the same resistance to the airflow as the communication plug-in unit 120. Therefore, the resistance to the airflow is uniform in the sub-rack unit 11 so that the air flows generated by the motor-fan plug-in units 140 are fed into and effectively air-cool each communication plug-in unit 120.

Figure 23:
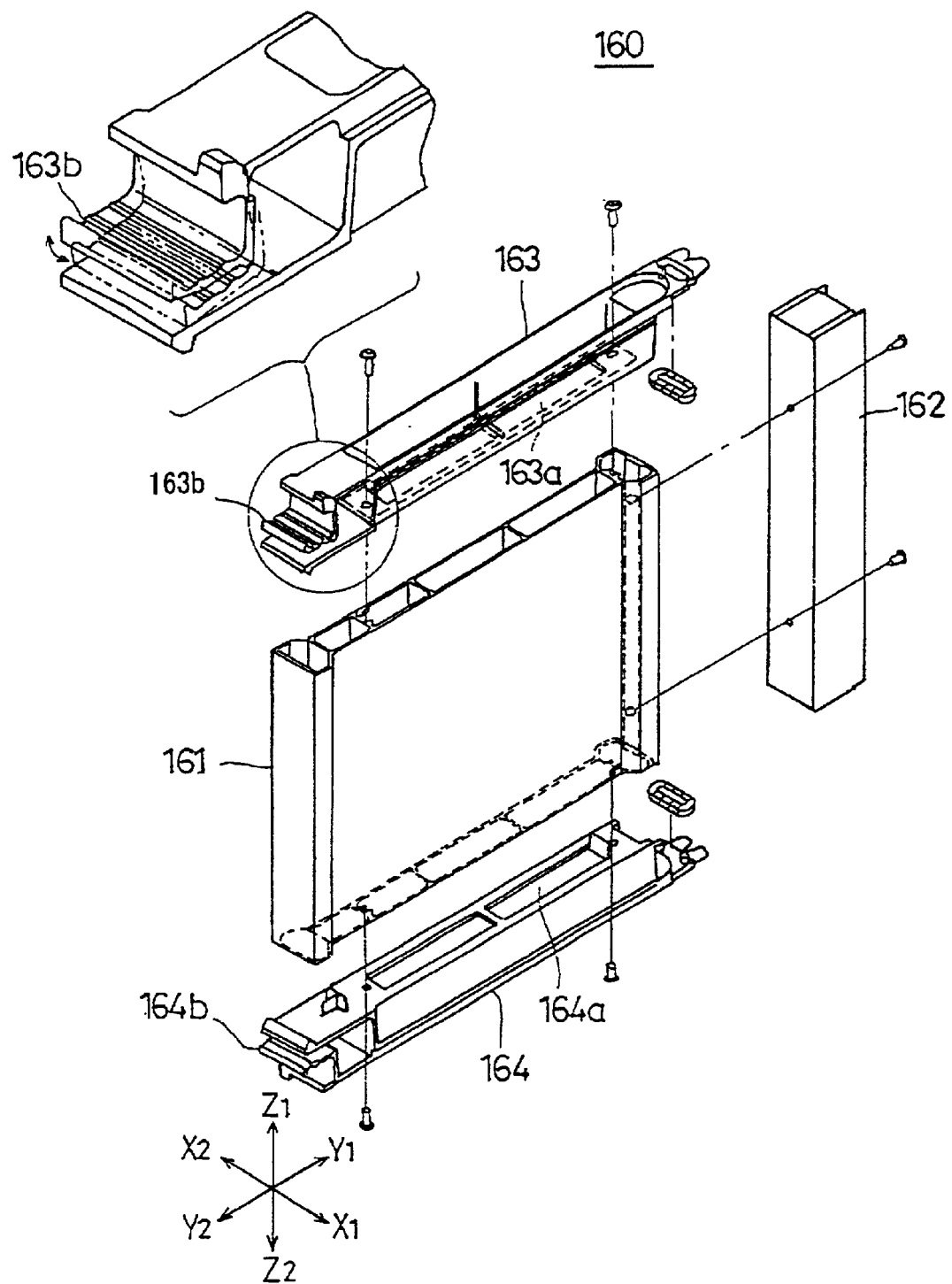
FIG. 23 is an exploded perspective view of a filler plug-in unit according to the embodiment of the present invention.

FIG. 23 is an exploded perspective view of the filler plug-in unit 160.

As shown in FIG. 23, the filler plug-in unit 160 includes a frame member 161 shaped like a flat rectangular parallelepiped. A box-like member 162 is screwed to the $Y_1$ end portion of the frame member 161. Slider members 163 and 164 are screwed to the top and bottom of the frame member 161, respectively. Each of openings 163a and 164a of the respective slider members 163 and 164 is provided to have a size such that the filler plug-in unit 160 has the same resistance to the airflow passing through inside the filler plug-in unit 160 as the communication plug-in unit 120. Elastically deformable hook parts 163b and 164b are formed on the $Y_2$ ends of the slider members 163 and 164, respectively.

The filler plug-in unit 160 is mounted in the sub-rack unit 11 with the slider members 163 and 164 being guided by the corresponding guide rail parts 20a and 21a, respectively, to be inserted into the sub-rack unit 11 until the hook parts 163b and 164b engage with convex parts 20d and 21d formed on the tips of the guide rail parts 20a and 21a, respectively.

The Card Lever Assemblies 52 and 53

Figure 24:
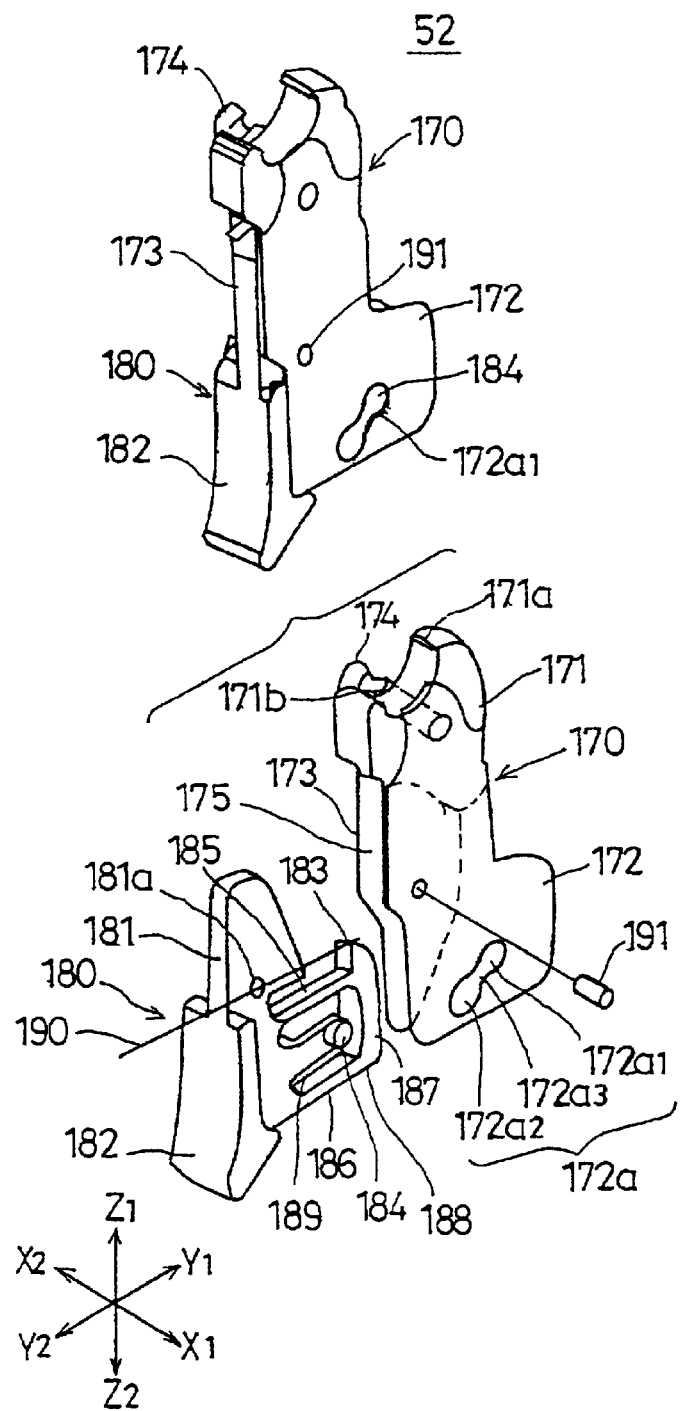
FIG. 24 is a diagram showing one of the card lever assemblies shown in FIG. 13.
Figure 25A:
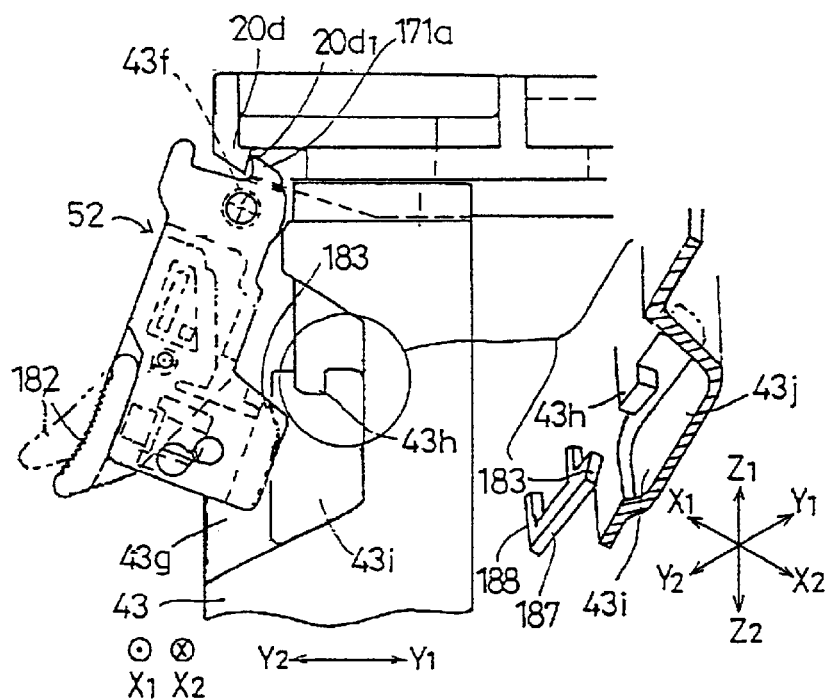
FIGS. 25A and 25B are diagrams for illustrating an operation and a movement of the card lever assembly of FIG. 24 in a case of mounting the communication plug-in unit.
Figure 25B:
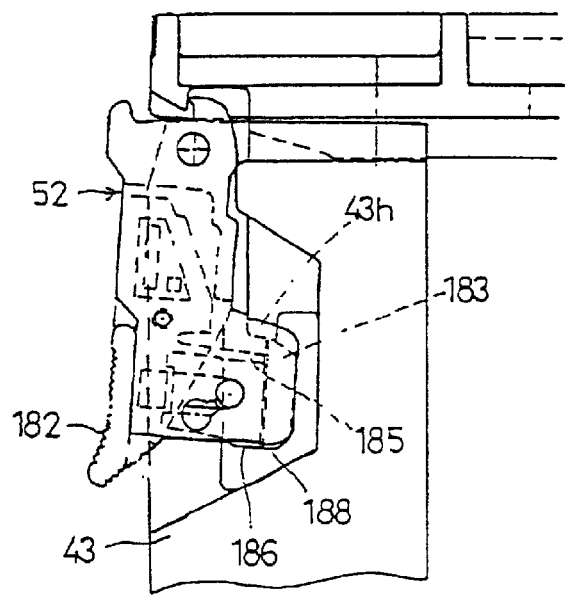
Figure 26A:
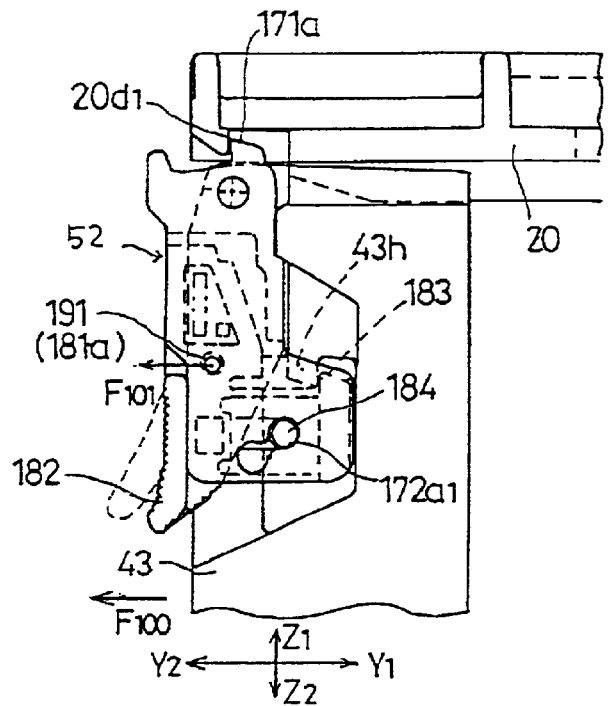
FIGS. 26A and 26B are diagrams for illustrating an operation and a movement of the card lever assembly in a case of dismounting the communication plug-in unit.
Figure 26B:
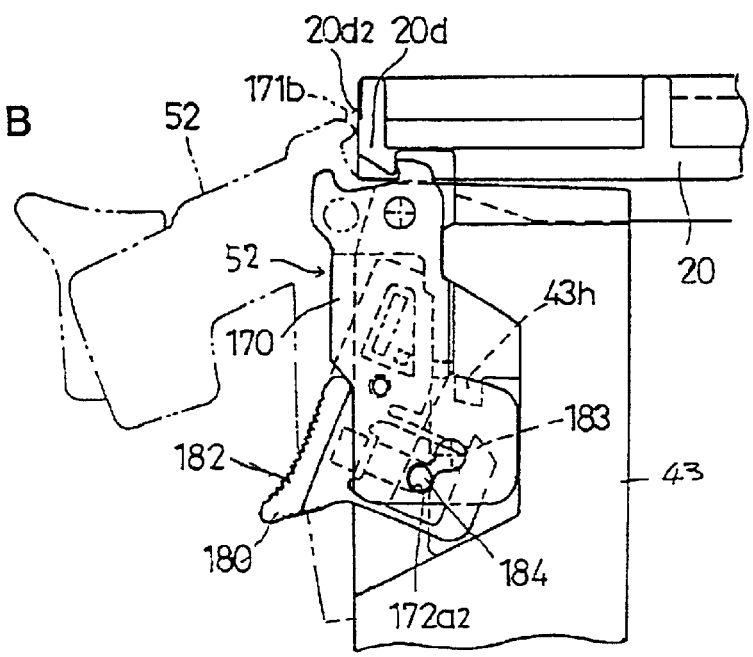

FIG. 24 is a diagram showing the card lever assembly 52. FIGS. 25A and 25B are diagrams for illustrating an operation and a movement of the card lever assembly 52 in the case of mounting the communication plug-in unit 40. FIGS. 26A and 26B are diagrams for illustrating an operation and a movement of the card lever assembly 52 in the case of dismounting the communication plug-in unit 40.

As shown in FIGS. 24 and 25A, the card lever assembly 52 includes a metal main body 170 and a synthetic-resin auxiliary lever 180.

The main body 170 includes a main part 171, metal plates 172 and 173 between which the main part 171 is interposed, and a shaft 174 penetrating the main part 171 to protrude in the $X_2$ direction. The shaft 174 provides caulking to fix the metal plates 172 and 173 to the main part 171. The main part 171 includes cam parts 171a and 171b opposing each other with a U-shaped concave portion being formed therebetween. An opening 172a shaped like two connected circles is formed in the metal plate 172. The opening 172a is formed of a first circular opening part $172a_1$, a second circular opening part $172a_2$, and a connection slit part $172a_3$ connecting the first and second circular opening parts $172a_1$ and $172a_2$. A space 175 for housing the auxiliary lever 180 is formed between the metal plates 172 and 173.

The auxiliary lever 180 includes a main part 181 including a hole 181a, a knob part 182 formed on an end of the main part 181, a hook part 183, a convex part 184, a frame part 188 of a C-like shape including arm parts 185 and 186 extending from the main part 180 in the $Y_1$ direction parallel to each other and a connection part 187 connecting the tip portions of the arm parts 185 and 186, and an arm part 189 extending from the main part 181 in the $Y_1$ direction within the frame part 188. The hook part 183 is formed on the tip portion of the arm part 185 to protrude in the $Z_1$ direction. The convex part 184 is formed on the tip portion of the arm part 189 to protrude in the $X_1$ direction. The hook part 183 and the hole 181a are positioned on an imaginary line 190 parallel to the Y-axis in the $Z_1$ direction. The frame part 188 forms a so-called parallel link mechanism.

The auxiliary lever 180 excluding the knob part 182 is housed in the space 175 inside the main body 170 and is attached thereto by a pin 191. The pin 191 supports the auxiliary lever 180 so that the auxiliary lever 180 is rotationally movable. The metal plate 173 is smaller than the metal plate 172 in size so that the hook part 183 is exposed inside the metal plate 172.

The card lever assembly 52 is housed in a concave part 43g formed on the $X_1$ side surface of the upper end portion of the front member 43 with the shaft 174 being inserted into a hole 43f formed in the front member 43 of the communication plug-in unit 40.

As shown in FIG. 25A, the concave part 43g includes a convex part 43h and a recess 43i slightly concave in the $X_2$ direction. The recess 43i is formed around the convex part 43h so that the convex part 43h is apart from a wall 43j of the recess 43i.

Next, a description will be given of the operation and movement of the card lever assembly 52.

At the final stage of mounting the communication plug-in unit 40, the user presses the knob part 182 of the card lever assembly 52 in a state indicated by a dot-dash line in FIG. 25A in the $Y_1$ direction with her/his finger. By this pressing operation, the auxiliary lever 180 is rotationally moved counterclockwise with respect to the main body 170 so that the convex part 184 is fitted into the first circular opening part $172a_1$. Thereby, the metal plates 172 and 173 are pressed via the knob part 182 so that the card lever assembly 52 is rotationally moved counterclockwise to be in a state shown in FIG. 26A by way of a state shown in FIG. 25B.

The counterclockwise rotational movement of the card lever assembly 52 presses the cam part 171a against an inner face $20d_1$ of the convex part 20d formed on the tip of the guide rail part 20a so that strong force is exerted in the $Y_1$ direction on the communication plug-in unit 40 because of the principle of the lever.

Further, as shown in FIG. 25B, the hook part 183 of the auxiliary lever 180 passes the convex part 43h deflecting the frame part 188 so as to engage with the convex part 43h in a position shown in FIG. 26A. Thereby, the card lever assembly 52 is locked in this position, so that the communication plug-in unit 40 is locked to be mounted in the sub-rack unit 11.

The hook part 183 and the frame part 188 are apart from the wall 43j of the recess 43i. Therefore, the hook part 183 passes the convex part 43h with good force to snap into engagement therewith without the hook part 183 and the frame part 188 rubbing the wall 43j. Thus, the user can acoustically confirm the mounting of the communication plug-in unit 40.

Here, a description will be given of a case where an earthquake or the like causes a force $F_{100}$ to be exerted on the communication plug-in unit 40 in a mounted state in a direction to protrude from the sub-rack unit 11.

In FIG. 26A, when the force $F_{100}$ is exerted, the cam part 171a is pressed against the inner face $20d_1$ so that a force to rotationally move the card lever assembly 52 clockwise is generated therein. With respect to the auxiliary lever 180, a force $F_{101}$ is exerted in the $Y_2$ direction on the pin 191, or the hole 181a.

Since the hook part 183 is positioned in the $Y_1$ direction with respect to the hole 181a, no component arises from the force $F_{101}$ in a direction to disengage the hook part 183 from the convex part 43h when the force $F_{100}$ is exerted. Further, the hook part 183 is formed on the arm part 185 of the frame part 188 including the arm part 186 and the connection part 187. This structure prevents the hook part 183 from being easily displaced in the $Z_2$ direction compared with a structure without the arm part 186 and the connection part 187. This securely maintains the engagement of the hook part 183 with the convex part 43h so that the card lever assembly 52 is securely held in a locked state.

Therefore, such an accident that the mounted communication plug-in unit 40 is dismounted from the sub-rack unit 11 is reliably prevented.

In order to extract the communication plug-in unit 40 from the sub-rack unit 11, the user pulls the knob part 182 of the card lever assembly 52 in the state shown in FIG. 26A in the $Y_2$ direction with her/his finger, and then lifts the knob part 182 up in the $Z_1$ direction to rotationally move the card lever assembly 52 clockwise as indicated by a double dot chain line in FIG. 26B.

When the knob part 182 is pulled in the $Y_2$ direction in the state of FIG. 26A, as shown in FIG. 26B, the auxiliary lever 180 is rotationally moved clockwise to disengage the hook part 183 from the convex part 43h so that the card lever assembly 52 is unlocked.

When the card lever assembly 52 is rotationally moved clockwise, the cam part 171b is pressed against an outer face $20d_2$ of the convex part 20d formed on the tip of the guide rail part 20a so that strong force is exerted in the $Y_2$ direction on the communication plug-in unit 40 because of the principle of the lever. As a result, the connectors 51 are disconnected from the connectors 30 to release the connections thereof.

The convex part 184 is fitted into the first and second circular opening parts $172a_1$ and $172a_2$ so as to maintain the care lever assembly 52 in the two rotational positions with respect to the main part 170. The convex part 184 passes the connection slit part 172a₃ with the arm part 189 being deflected, so that the auxiliary lever 180 is rotationally moved with respect to the main part 170.

Therefore, if the communication plug-in unit 40 is mounted in the sub-rack unit 11 with the knob part 182 being in a state indicated by a broken line in FIG. 26A, the user can observe this state to visually recognize that the card lever assembly 52 is unlocked. This prevents the card lever assembly 52 from being left unlocked.

The card lever assembly 53 has the same structure as the card lever assembly 52.

The present invention is not limited to the specifically disclosed embodiment, but variations and modifications may be made without departing from the scope of the present invention.

The present application is based on Japanese priority application No. 2000-232335 filed on Jul. 31, 2000, the entire contents of which are hereby incorporated by reference.

What is claimed is:

1. A communication device comprising:
 a sub-rack unit comprising:
  a back wiring board having first connectors arranged in lines thereon; and
  a frame plate including vertical ribs and placed on said back wiring board so that the vertical ribs separate the lines of the first connectors; and
 a plurality of plug-in units each comprising:
  a printed board including top and bottom sides, and parallel first and second sides perpendicular to the top and bottom sides, said printed board having second connectors provided on the first side thereof;
  a metal case including top and bottom faces, and parallel first and second side faces perpendicular to the top and bottom faces so as to cover said printed board; and
  first and second spring members,
 wherein each of said plug-in units is mounted in said sub-rack unit with the first and second connectors being connected so that the first and second side faces of said metal case are pressed outward against the vertical ribs of said frame plate by resilient forces generated by elastic deformation of said first and second spring members, respectively.

2. The communication device as claimed in claim 1, wherein:
 each of the plug-in units further comprises:
  a front board member attached to the second side of said printed board;
  first and second arm members extending horizontally from top and bottom end portions of said front member, respectively; and
  first and second pillar members provided vertically to oppose each other between said first and second arm members; and
 said first and second spring members are attached to inner faces of the first and second side faces of said metal case so as to contact said first and second pillar members, respectively.

3. The communication device as claimed in claim 1, wherein said printed board is supported so as to be displaceable in a rotational direction around the second side of said printed board.

4. The communication device as claimed in claim 1, wherein:
 each of said plug-in devices further comprises a shield member provided on one end portion of each of the top and bottom faces of said metal case so that said shield members elastically deform to be pressed against said frame plate when each of said plug-in units is mounted in said sub-rack unit.

5. The communication device as claimed in claim 1, wherein:
 each of said plug-in units further comprises first and second slider members provided on the top and bottom faces of said case metal, respectively, the second slider member having a downward convex part formed on one end portion thereof, the one end portion being in a reverse direction to said sub-rack unit when each of said plug-in units is inserted thereinto;
 said sub-rack unit further comprises a pair of first and second guide rail parts for guiding each of said plug-in units to be inserted into said sub-rack unit, the second guide rail part having a notch formed on one end portion thereof on an insertion side from which each of said plug-in units is inserted into the sub-rack unit; and
 each of said plug-in units is mounted in the sub-rack unit in a required position when inserted into the sub-rack unit with said first and second slider members being guided by said first and second guide rail parts, respectively, until the downward convex part engages with the notch, and is prevented from being mounted in the sub-rack unit by a contact of the downward convex part with one end of the first guide rail part on the insertion side when inserted upside down into the sub-rack unit.

6. The communication device as claimed in claim 2, wherein said first and second pillar members include first and second portions made of an insulating material, respectively, so that said first and second spring members contact said first and second portions, respectively.

7. The communication device as claimed in claim 2, wherein:
 said printed board has first and second notch parts formed in positions close to the first side thereof on the top and bottom sides thereof, respectively;
 said first and second arm members have first and second pins fitted into said first and second notch parts, respectively; and
 said front member has first and second card lever assemblies provided on the top and bottom end portions thereof, respectively, so that operations of said first and second card lever assemblies cause said first and second pins to press said first and second notch parts so as to exert forces to press each of the plug-in units into the sub-rack unit on the first and second notch parts, respectively.

8. A plug-in unit comprising:
 a printed board;
 a metal case including top and bottom faces, and parallel first and second side faces perpendicular to the top and bottom faces so as to cover said printed board, the first and second side faces each having an open end; and
 first and second spring members that elastically deform in response to inward deformation of the open ends of the first and second side faces of said metal case so as to press outward the open ends of the first and second side faces, respectively, by resilient force thereof,
 wherein said metal case further comprises first and second pillar members provided vertically to oppose each other between the top and bottom faces, said first and second spring members are attached to inner faces of the first and second side faces of said metal case so as to contact said first and second pillar members, respectively, and the first spring member is compressible between the inner face of the first side face of said metal case and said first pillar member, and the second spring member is compressible between the inner face of the second side face of said metal case and said second pillar member.

9. The plug-in unit as claimed in claim 8, wherein each of said first and second spring members is formed of a plurality of leaf springs.

10. A communication device comprising:

a sub-rack unit comprising:

a back wiring board having connectors; and first and second guide rail parts being attached to a top side and a lower portion of said sub-rack unit, respectively;

a plurality of plug-in units being inserted along the first and second guide rail parts into said sub-rack unit to be plugged into the connectors of said sub-rack unit;

a member for forming an air reservoir room formed under the second guide rail parts; and a plurality of motor-fan units each having a motor fan and a lid member, said motor-fan units being detachably plugged into said sub-rack unit under said member for forming the air reservoir room so that said lid members are pressed against a bottom face of said member for forming the air reservoir room so as to sealably integrate the motor-fan units and said member for forming an air reservoir room, wherein each of said lid members is provided on the motor fan, and includes a projection part formed on an end portion thereof, the end portion being in a direction in which each of said motor-fan units is plugged into said sub-rack unit, the projection part having a top face tilt in said direction.

11. The communication device as claimed in claim 10, wherein:

each of said lid members includes a packing around the motor; and the packing is compressed to allow the lid member to be pressed against the bottom face of said member for forming the air reservoir room when each of said motor-fan units is plugged into said sub-rack unit.

12. The communication device as claimed in claim 10, further comprising:

a filler plug-in unit having the same size and resistance to airflow as each of said plug-in units, the filler plug-in unit being filled into a space left in said sub-rack unit.

* * * * *